United States Patent
Yamaguchi et al.

(10) Patent No.: US 8,008,140 B2
(45) Date of Patent: Aug. 30, 2011

(54) METHOD FOR MANUFACTURING SEMICONDUCTOR DEVICE INCLUDING HAT-SHAPED ELECTRODE

(75) Inventors: Mayumi Yamaguchi, Atsugi (JP); Atsuo Isobe, Atsugi (JP); Satoru Saito, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 558 days.

(21) Appl. No.: 11/256,086

(22) Filed: Oct. 24, 2005

(65) Prior Publication Data
US 2006/0091398 A1    May 4, 2006

(30) Foreign Application Priority Data
Nov. 4, 2004   (JP) ................. 2004-321009

(51) Int. Cl.
*H01L 21/00* (2006.01)
(52) U.S. Cl. .............. 438/164; 438/521; 257/E21.619
(58) Field of Classification Search ............ 438/149, 438/151, 519, 527, 163, 588, 689, 706, 735, 438/738, 745, 751, 157, 164, 734, 521, 595; 257/E21.026, E21.535, E21.618, E21.621, 257/E21.635, E21.638, E21.619
See application file for complete search history.

(56) References Cited

U.S. PATENT DOCUMENTS

| | | | |
|---|---|---|---|
| 5,403,772 A | 4/1995 | Zhang et al. |
| 5,426,064 A | 6/1995 | Zhang et al. |
| 5,576,556 A | 11/1996 | Takemura et al. |
| 5,595,944 A | 1/1997 | Zhang et al. |
| 5,639,698 A | 6/1997 | Yamazaki et al. |
| 5,644,147 A | 7/1997 | Yamazaki et al. |
| 5,648,277 A | 7/1997 | Zhang et al. |
| 5,807,770 A | 9/1998 | Mineji |
| 5,814,540 A | 9/1998 | Takemura et al. |
| 5,818,070 A | 10/1998 | Yamazaki et al. |
| 5,897,347 A | 4/1999 | Yamazaki et al. |
| 5,923,968 A | 7/1999 | Yamazaki et al. |

(Continued)

FOREIGN PATENT DOCUMENTS
CN    1312589    9/2001
(Continued)

OTHER PUBLICATIONS
Office Action (Application No. 200510118686.5) dated Feb. 12, 2010.

*Primary Examiner* — Matthew C Landau
*Assistant Examiner* — Joseph C Nicely
(74) *Attorney, Agent, or Firm* — Eric J. Robinson; Robinson Intellectual Property Law Office, P.C.

(57) ABSTRACT

It is an object of the present invention to manufacture a TFT having a small-sized LDD region in a process with a few processing step and to manufacture TFTs each having a structure depending on each circuit separately. According to the present invention, a gate electrode is a multilayer, and a hat-shaped gate electrode is formed by having the longer gate length of a lower-layer gate electrode than that of an upper-layer gate electrode. At this time, only the upper-layer gate electrode is etched by using a resist recess width to form the hat-shaped gate electrode. Accordingly, an LDD region can be formed also in a fine TFT; thus, TFTs having a structure depending on each circuit can be manufactured separately.

23 Claims, 29 Drawing Sheets

U.S. PATENT DOCUMENTS

| | | | |
|---|---|---|---|
| 5,956,579 A | 9/1999 | Yamazaki et al. | |
| 5,962,897 A | 10/1999 | Takemura et al. | |
| 5,986,286 A | 11/1999 | Yamazaki et al. | |
| 6,074,900 A | 6/2000 | Yamazaki et al. | |
| 6,218,678 B1 | 4/2001 | Zhang et al. | |
| 6,259,138 B1 | 7/2001 | Ohtani et al. | |
| 6,274,887 B1 | 8/2001 | Yamazaki et al. | |
| 6,303,963 B1 | 10/2001 | Ohtani et al. | |
| 6,355,512 B1 | 3/2002 | Yamazaki et al. | |
| 6,365,917 B1 | 4/2002 | Yamazaki | |
| 6,369,410 B1 | 4/2002 | Yamazaki et al. | |
| 6,372,655 B2 * | 4/2002 | Khan et al. | 438/714 |
| 6,455,875 B2 | 9/2002 | Takemura et al. | |
| 6,475,839 B2 | 11/2002 | Zhang et al. | |
| 6,479,838 B2 * | 11/2002 | Morosawa | 257/72 |
| 6,515,336 B1 * | 2/2003 | Suzawa et al. | 257/350 |
| 6,531,713 B1 | 3/2003 | Yamazaki | |
| 6,541,294 B1 * | 4/2003 | Yamazaki et al. | 438/29 |
| 6,545,359 B1 | 4/2003 | Ohtani et al. | |
| 6,562,671 B2 * | 5/2003 | Ohnuma | 438/160 |
| 6,596,571 B2 | 7/2003 | Arao et al. | |
| 6,605,496 B1 | 8/2003 | Yamazaki | |
| 6,611,108 B2 | 8/2003 | Kimura | |
| 6,613,614 B2 | 9/2003 | Yamazaki et al. | |
| 6,617,612 B2 | 9/2003 | Zhang et al. | |
| 6,624,477 B1 | 9/2003 | Takemura et al. | |
| 6,635,505 B2 * | 10/2003 | Tanaka et al. | 438/30 |
| 6,646,287 B1 | 11/2003 | Ono et al. | |
| 6,646,692 B2 | 11/2003 | Yamazaki et al. | |
| 6,670,640 B1 | 12/2003 | Yamazaki et al. | |
| 6,690,437 B2 | 2/2004 | Yamazaki et al. | |
| 6,706,544 B2 | 3/2004 | Yamazaki et al. | |
| 6,737,306 B2 | 5/2004 | Yamazaki et al. | |
| 6,747,289 B2 | 6/2004 | Yamazaki et al. | |
| 6,759,678 B2 | 7/2004 | Yamazaki et al. | |
| 6,773,996 B2 | 8/2004 | Suzawa et al. | |
| 6,790,749 B2 | 9/2004 | Takemura et al. | |
| 6,794,229 B2 | 9/2004 | Asami et al. | |
| 6,809,339 B2 | 10/2004 | Suzawa et al. | |
| 6,825,488 B2 | 11/2004 | Yamazaki et al. | |
| 6,847,341 B2 | 1/2005 | Kimura et al. | |
| 7,109,108 B2 | 9/2006 | Takemura et al. | |
| 7,112,817 B2 | 9/2006 | Yamazaki et al. | |
| 7,115,517 B2 * | 10/2006 | Ye et al. | 438/700 |
| 7,238,600 B2 * | 7/2007 | Yamazaki et al. | 438/163 |
| 7,262,469 B2 * | 8/2007 | Makita | 257/357 |
| 7,344,825 B2 * | 3/2008 | Nagai et al. | 430/316 |
| 7,402,525 B2 * | 7/2008 | Monoe | 438/706 |
| 7,435,685 B2 * | 10/2008 | Delgadino et al. | 438/700 |
| 7,528,445 B2 | 5/2009 | Phua et al. | |
| 2001/0055841 A1 * | 12/2001 | Yamazaki et al. | 438/151 |
| 2002/0000551 A1 * | 1/2002 | Yamazaki et al. | 257/59 |
| 2002/0025591 A1 | 2/2002 | Ohnuma et al. | |
| 2003/0027382 A1 * | 2/2003 | Uehara et al. | 438/200 |
| 2003/0164912 A1 * | 9/2003 | Eguchi et al. | 349/113 |
| 2003/0207502 A1 * | 11/2003 | Yamazaki et al. | 438/149 |
| 2004/0091820 A1 * | 5/2004 | Nagai et al. | 430/317 |
| 2004/0104424 A1 * | 6/2004 | Yamazaki | 257/321 |
| 2004/0110327 A1 * | 6/2004 | Ishikawa | 438/151 |
| 2004/0135216 A1 * | 7/2004 | Suzawa et al. | 257/408 |
| 2005/0074977 A1 * | 4/2005 | Kumihashi et al. | 438/706 |
| 2005/0173024 A1 * | 8/2005 | Brennan et al. | 148/33.2 |
| 2006/0097258 A1 * | 5/2006 | Yamazaki et al. | 257/59 |
| 2006/0197088 A1 * | 9/2006 | Isobe et al. | 257/59 |
| 2007/0007529 A1 | 1/2007 | Takemura et al. | |
| 2007/0138480 A1 * | 6/2007 | Yamazaki et al. | 257/72 |
| 2007/0246777 A1 * | 10/2007 | Yamazaki et al. | 257/350 |
| 2008/0182209 A1 * | 7/2008 | Nagai et al. | 430/313 |
| 2009/0101901 A1 * | 4/2009 | Yamazaki et al. | 257/59 |
| 2009/0315111 A1 * | 12/2009 | Yamazaki et al. | 257/354 |
| 2010/0099227 A1 * | 4/2010 | Yamazaki et al. | 438/164 |

FOREIGN PATENT DOCUMENTS

| | | |
|---|---|---|
| EP | 1071124 A2 * | 1/2001 |
| EP | 1132960 B | 9/2001 |
| JP | 06-124962 | 5/1994 |
| JP | 08-078329 | 3/1996 |
| JP | 08-250739 | 9/1996 |
| JP | 10-098199 | 4/1998 |
| JP | 2004-179330 | 6/2004 |
| JP | 2004-221115 | 8/2004 |

* cited by examiner

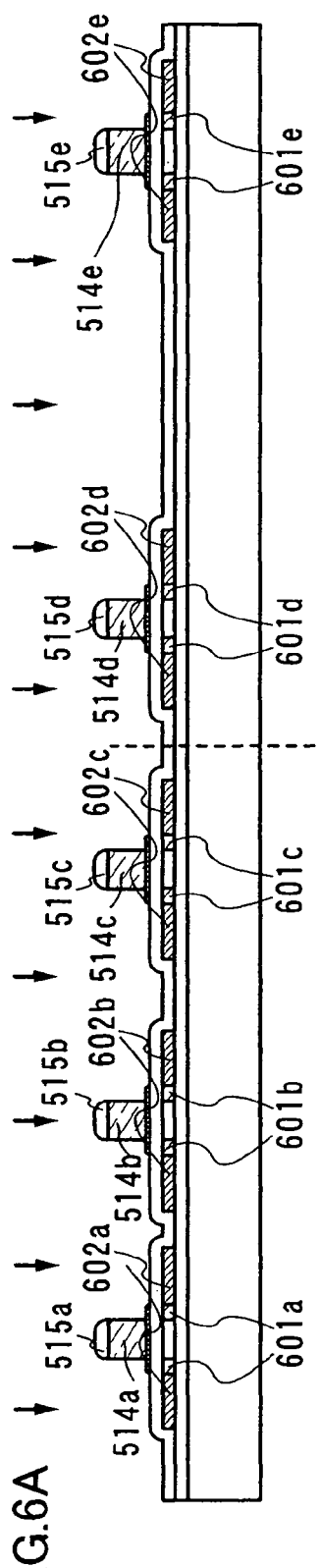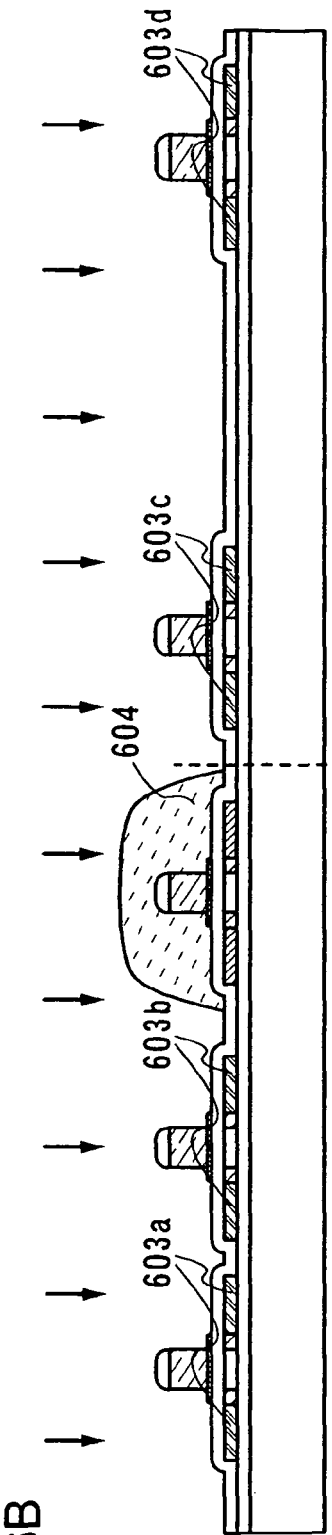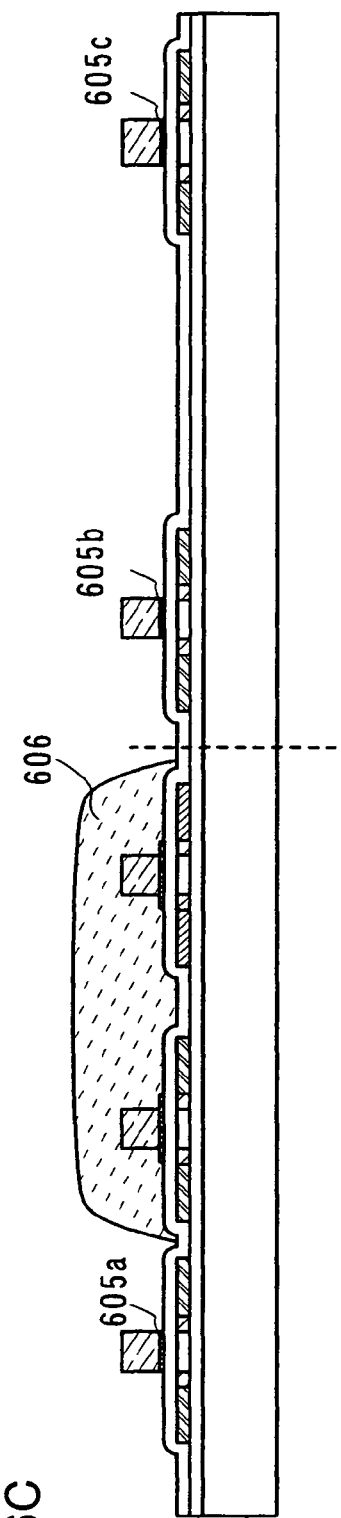

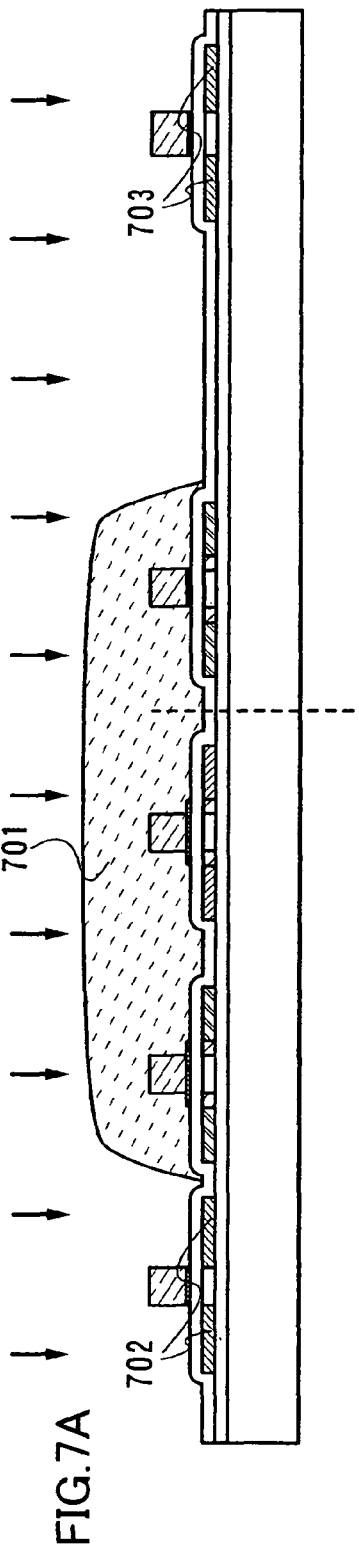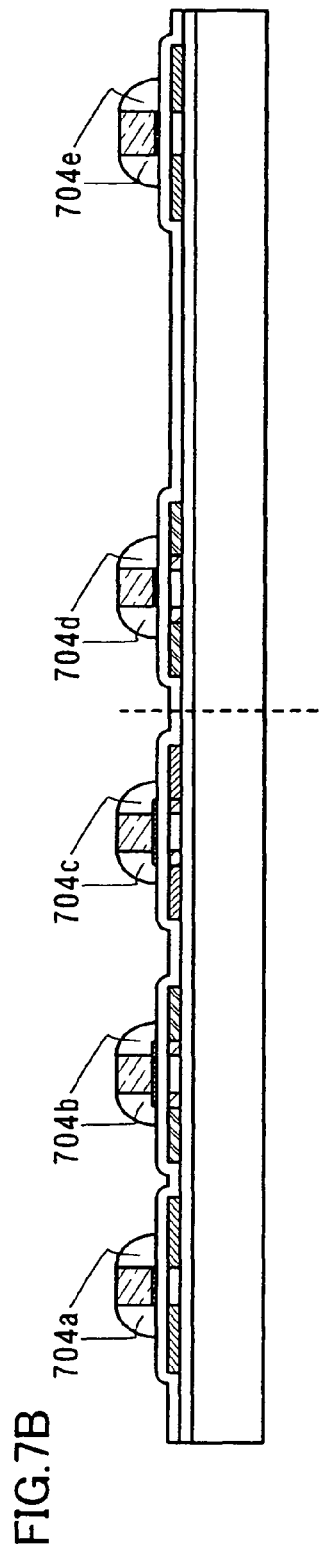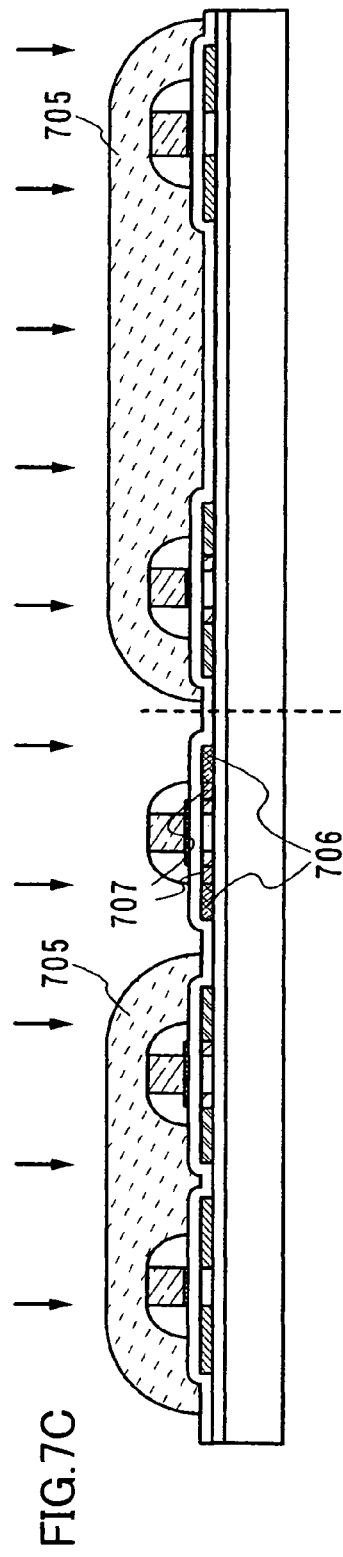

PRIOR ART

METHOD FOR MANUFACTURING SEMICONDUCTOR DEVICE INCLUDING HAT-SHAPED ELECTRODE

FIELD OF THE INVENTION

The present invention relates to a semiconductor device formed of various circuits and a manufacturing method thereof.

DESCRIPTION OF THE RELATED ART

A conventional thin film transistor (Thin Film Transistor: hereinafter, referred to as TFT) is formed of an amorphous semiconductor film; therefore, it is almost impossible to obtain a TFT having field effect mobility of 10 cm$^2$/V·Sec or more. However, a TFT having high filed effect mobility can be obtained owing to the appearance of a TFT formed of a crystalline semiconductor film.

Since the TFT formed of crystalline semiconductor films has high field effect mobility, various functional circuits can be formed over one substrate simultaneously by using the TFT. For example, in a display device, previously, a driver IC and the like are mounted on a display portion to have a driver circuit. On the other hand, the use of the TFTs formed of crystalline semiconductor films enables a display portion and a driver circuit formed of a shift register circuit, a level shifter circuit, a buffer circuit, a sampling circuit, and the like to be disposed over one substrate. The driver circuit is basically formed by a CMOS circuit including an n-channel TFT and a p-channel TFT.

In order to form various circuits over one substrate, it is necessary to form TFTs corresponding to each of the circuits. This is because, considering the case of a display device, operating conditions of pixel TFTs are not necessarily identical to those of TFTs in a driver circuit, and each TFT is thus required to have different properties. A pixel TFT formed of an n-channel TFT is used as a switching element to apply a voltage to liquid crystal. A pixel TFT is required to have a sufficiently small OFF current in order to store a charge accumulated in a liquid crystal layer within one frame period. On the other hand, a buffer circuit and the like in a driver circuit is applied with a high drive voltage; therefore, it is necessary to increase a withstand voltage so that the elements are not broken even by the high voltage applied. In addition, in order to obtain high ON current drive capacity, it is necessary to secure a sufficiently large ON current.

As a structure of a TFT for decreasing OFF current, there is one having a low-concentration drain region (hereinafter also referred to as an LDD (Light Doped Drain) region). This structure has a region doped with an impurity element at a low concentration between a channel-forming region and a source region or a drain region that is doped with an impurity element at high concentration. In addition, there is a so-called GOLD (Gate-drain Overlapped LDD) structure in which a LDD region is formed to overlap a gate electrode with a gate insulating film interposed therebetween as a means for preventing the deterioration in ON current due to hot carriers. According to such a structure, a high electric field in the vicinity of a drain is alleviated; therefore, it becomes possible to prevent the deterioration in ON current due to hot carriers. Note that, through a gate insulating film, an LDD region where the gate electrode is not overlapped is referred to as a Loff region, while an LDD region where the gate electrode is overlapped is referred to as a Lov region.

Here, the Loff region works effectively in suppressing OFF current, whereas it does not work effectively in preventing the deterioration in ON current due to hot carriers by alleviating the electric field in the vicinity of the drain. On the other hand, the Lov region works effectively in preventing the decrease in ON current by relieving the electric field in the vicinity of the drain; however, it does not work effectively in suppressing OFF current. Thus, it is necessary to form TFTs depending on appropriate TFT characteristic that is required for each of the various circuits.

As one of the methods for manufacturing TFTs having various structures over one substrate simultaneously, a so-called hat-shaped two-layer structure gate electrode of which gate length of the bottom layer is longer than that of the upper layer is used to form a plurality of TFTs each having an LDD region over one substrate simultaneously (for example, see Reference 1 (Japanese Patent Application Laid-Open No. 2004-179330 (see FIGS. 5 to 8)). FIGS. 18A to 18D show the manufacturing method.

First, a base insulating film 2, a semiconductor film 3, a gate insulating film 4, a first conductive film 5 to be a gate electrode, and a second conductive film 6 to be a gate electrode are stacked over substrate 1 sequentially, and a resist mask 7 is formed over the second conductive film (FIG. 18A). Next, the first conductive film and the second conductive film are etched by dry etching to have the sidewalls in a tapered shape and gate electrodes 8 and 9 are formed (FIG. 18B). Subsequently, the gate electrode 9 is processed by anisotropic etching. Accordingly, a hat-shaped gate electrode of which cross-sectional shape is like a hat is formed (FIG. 18C). Thereafter, LDD regions 10a below the gate electrode 8, high-concentration impurity regions 10b at the both ends of the semiconductor film in contact with the LDD regions, and a channel-forming region 10c are formed by doping an impurity element twice (FIG. 18D).

At present, research on a submicron TFT is actively carried out. However, it is difficult to form a minute TFT appropriate for various circuits by using the method described in Reference 1. This is because it is difficult to be shorten up the length in a gate length direction (hereinafter, referred to as a LDD length) of the LDD region to a desired value. As shown in FIGS. 18A to 18D, Reference 1 shows a method in which the tapered-side surface of the gate electrode 9 is etched to form a hat-shaped gate electrode and the LDD region 10a is formed by doping. Therefore, when a taper angle (θ) of the side surface of the gate electrode 9 shown in FIG. 18B is made close to 90°, the LDD length gets shorter. However, it is difficult to adjust the taper angle and, on the other hand, when θ is 90°, the LDD region itself cannot be formed; therefore, it is difficult to form an LDD length of a certain value or less.

When the LDD length cannot be shorten, the length in a channel length direction of the semiconductor film cannot be shorten too; thus, a TFT having an LDD structure whose size is a certain value or less cannot be formed as a consequence.

In addition, while the LDD region suppresses, a hot carrier or short channel effect, it functions as resistance against ON current as well. Therefore, in each TFT, there is such an optimum LDD length that can obtain a desired ON-current as well as suppressing a hot carrier and the like. However, in the conventional method, although the length of a gate electrode and a semiconductor film can be formed in a submicron size by etching, it is difficult to provided an LDD region having an LDD length in accordance with its size. Thus, it is difficult to obtain a submicron TFT having a preferable characteristic.

Moreover, when the gate length is shortened by miniaturization, short channel effect is likely to be generated; therefore, the necessity to provide a Loff region gets higher. Further, a Lov region contributes to improvement of TFT reliability and thus a TFT having a much preferable characteristic can be obtained. Therefore, the necessity to provide an LDD region in a miniaturized TFT is extremely high. In other words, even in a miniaturized TFT, it is required to develop a method for manufacturing a semiconductor device in which TFTs having an LDD structure and a GOLD structure each having an LDD length appropriate for each TFT are formed simultaneously and various circuits are manufactured simultaneously over one substrate.

Furthermore, in terms of a manufacturing cost, it is required to develop a method for manufacturing a semiconductor device in which TFTs appropriate for each circuit are manufactured simultaneously in a process with a few processing step.

As mentioned above, it is an object of the present invention that even a miniaturized TFT has appropriate structures for the function of the various circuits in order to improve the operating characteristics and reliability of the semiconductor device. In addition, it is an object of the present invention in order to reduce the number of manufacturing processes with the purpose of reduction in manufacturing cost and improvement of the yield.

SUMMARY OF THE INVENTION

According to one feature of the present invention, a gate insulating film, a first conductive film, and a second conductive film are sequentially formed over a semiconductor film over a substrate; a resist is formed over the second conductive film; a first gate electrode is formed by performing first etching to the second conductive film with the use of the resist as a mask; a second gate electrode is formed by performing second etching to the first conductive film; and the resist is recessed by performing third etching to the first gate electrode and etching the first gate electrode as well by using the recessed resist as a mask to form a third gate electrode of which gate length is shorter than that of the second gate electrode.

According to another feature of the present invention, the resist is recessed at the second etching.

According to another feature of the present invention, after forming the third gate electrode, a channel-forming region and low-concentration impurity regions in contact with the channel-forming region are formed in the semiconductor film by doping an impurity element with the use of the third gate electrode as a mask; and high-concentration impurity regions are formed selectively in the low-concentration impurity regions by doping an impurity element with the use of the second gate electrode as a mask.

According to another feature of the present invention, after forming the third gate electrode, a channel-forming region and low-concentration impurity regions in contact with the channel-forming region are formed in the semiconductor film by doping an impurity element with the use of the third gate electrode as a mask; high-concentration impurity regions are formed selectively in the low-concentration impurity regions by doping an impurity element with the use of the second gate electrode as a mask; and the second gate electrode is etched by using the third gate electrode as a mask to make the length of the third gate electrode and the second gate electrode the same.

According to another feature of the present invention, after forming the third gate electrode, a channel-forming region and low-concentration impurity regions in contact with the channel-forming region are formed in the semiconductor film by doping an impurity element with the use of the third gate electrode as a mask; and sidewalls in contact with the side surfaces of the second gate electrode and the third gate electrode is formed and high-concentration impurity regions are formed selectively in the low-concentration impurity regions by doping an impurity element with the use of the sidewalls and the third gate electrode as masks.

According to another feature of the present invention, the low-concentration impurity regions are formed, through the gate insulating film, below the second gate electrode where the third gate electrode is not overlapped by performing the doping with the use of the second gate electrode as a mask.

According to another feature of the present invention, the high-concentration impurity regions are formed, through the gate insulating film, in the semiconductor film where the second gate electrode is not overlapped by performing the doping with the use of the second gate electrode as a mask.

According to another feature of the present invention, first low-concentration impurity regions below the second gate electrode where the third gate electrode is not overlapped and second low-concentration impurity regions below the sidewalls; in contact with the gate insulating film are formed by performing the doping with the use of the sidewalls and the third gate electrode as masks. At this time, the total width of the first low-concentration impurity regions and the second low-concentration impurity regions in each channel length direction is identical with the width of the sidewalls in a channel length direction. In addition, the width of the first low-concentration impurity regions in a channel length direction is identical with the width in a channel length direction of the second gate electrode where the third gate electrode is not overlapped.

According to another feature of the present invention, the first gate electrode is formed so that a taper angle on the side surface is $80° \leq \theta \leq 90°$. In other words, the first gate electrode is formed to have a taper angle of nearly 90°.

According to another feature of the present invention, the first conductive film is a TaN film. According to further another feature of the present invention, the second conductive film is a W film. In addition, the first to third etching are performed by a dry etching method.

A method for forming a hat-shaped gate electrode of the present invention is different from the forming method using a tapered part of the first electrode in FIGS. 18A to 18D. According to the present invention, by utilizing a resist recess width during etching, a hat-shaped gate electrode is formed by performing etching so that the gate length of the first gate electrode gets shorter than that of the second gate electrode. The resist recess width during etching of the present invention is a resist recess width that is obtained at the third etching when the first gate electrode is etched. Alternatively, at the second etching when the second gate electrode is formed, the resist may be etched simultaneously; therefore, the resist recess width refers to the total resist recess width at the second and third etching.

Further, an impurity element is doped into a semiconductor film by using the above hat-shaped gate electrode according to the present invention as a mask; therefore, various semiconductor devices each having a Lov region or a Loff region is manufactured over one substrate.

Furthermore, after forming the hat-shaped gate electrode, one sidewalls on the both side surfaces of the second and third gate electrodes are formed so as to cover the side surfaces of the both gate electrodes. An impurity element is doped by using the sidewalls and the third gate electrode as masks; therefore, a semiconductor device having both a Lov region and a Loff region is manufactured.

A taper angle on the side surface of the first gate electrode formed at the first etching of the present invention is 80° to 90°.

The LDD length of an LDD region of the present invention is 10 nm to 300 nm, preferably 50 nm to 200 nm. In addition, the channel length of a channel-forming region of the present invention is within the range of 0.1 μm to 0.7 μm.

Note that, in this specification, a hat-shaped gate electrode is a gate electrode having a multilayer structure at least including two layers. The hat-shaped gate electrode also refers to a gate electrode in which the gate length of a lower-layer gate electrode is longer than that of a upper-layer gate electrode, and the upper-layer gate electrode is thicker than the lower-layer gate electrode. The shape of the lower-layer gate electrode may be widen toward the end or may be rectangular in its cross section.

According to the present invention, a fine hat-shaped gate electrode can be formed, and an LDD region having an LDD length that cannot be accomplished conventionally can be formed by doping an impurity element with the use of this gate electrode as a mask. Therefore, in spite of miniaturization, a high-reliability semiconductor device with preferable operating characteristics can be realized; thus, semiconductor devices appropriate for various circuits can be manufactured separately. Moreover, semiconductor devices can be manufactured separately in a process having a few processing step; therefore, the manufacturing cost can be reduced and the yield can be improved.

Further, a submicron TFT in a desired size can be formed without limiting the size, and a semiconductor device itself can be extremely compact and lightweight. Moreover, an LDD length appropriate for each TFT can be designed; thus, a semiconductor device in which desired ON current can be ensured as well as suppressing short-channel effect and increasing withstand pressure can be obtained.

Furthermore, sidewalls are formed on the sides of a hat-shaped gate electrode and an impurity element is doped; therefore, a high-reliability semiconductor device capable of suppressing short channel effect and having both a Loff region and a Lov region can be realized.

An LDD region having an extremely short LDD length of 10 nm to 300 nm, preferably 50 nm to 200 nm can be formed by doping an impurity element with the use of a hat-shaped gate electrode of the present invention as a mask. In addition, in a fine TFT of which channel length is 0.1 μm to 0.7 μm, a TFT having an LDD region appropriate for the TFT size can be formed.

These and other objects, features and advantages of the present invention will become more apparent upon reading of the following detailed description along with the accompanied drawings.

BRIEF DESCRIPTION OF THE DRAWINGS

In the accompanying drawings:

FIGS. 6A to 6C are views each showing Embodiment Mode 4 according to a certain aspect of the present invention;

FIGS. 7A to 7C are views each showing Embodiment Mode 4 according to a certain aspect of the present invention;

DETAILED DESCRIPTION OF THE INVENTION

Figure 1A:
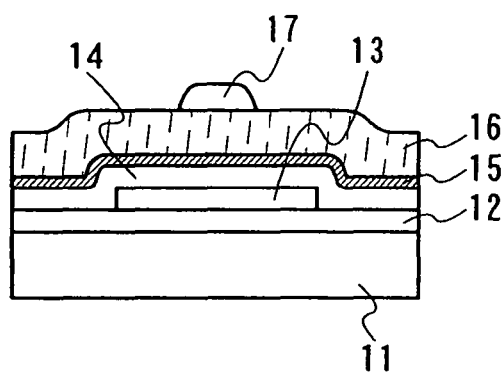
FIGS. 1A to 1D are views each showing Embodiment Mode 1 according to a certain aspect of the present invention.

Embodiment Mode of the present invention will be described below with reference to the accompanying drawings. However, it is to be easily understood that various changes and modifications will be apparent to those skilled in the art. Therefore, unless such changes and modifications depart from the invention, they should be construed as being included therein.

In addition, Embodiment Mode 1 to Embodiment Mode 6 described below can be arbitrarily combined within the range of enablement.

Embodiment Mode 1

Hereinafter, a method for manufacturing a semiconductor device according to Embodiment Mode 1 is shown with reference to FIGS. 1A to 1D and FIGS. 2A to 2C. A TFT used in the semiconductor device of this embodiment mode has an LDD region of a Lov region or a Loff region.

First, a base insulating film 12 is formed over a substrate 11 in a thickness of 100 nm to 300 nm. The substrate 11 may be an insulating substrate such as a glass substrate, a quartz substrate, a plastic substrate, or a ceramic substrate; a metal substrate; a semiconductor substrate; or the like.

The base insulating film 12 can be formed using a single layer structure or a multilayer structure of an insulating film having oxygen or nitrogen such as silicon oxide ($SiO_x$), silicone nitride ($SiN_x$), silicon oxynitride ($SiO_xN_y$) (x>y), or silicon nitride oxide ($SiN_xO_y$) (x>y). It is preferable to form a base insulating film in particular when impurities from a substrate are concerned.

In addition, it preferable that the base insulating film 12 in contact with a semiconductor film is a silicon nitride film or a silicon nitride oxide film in a thickness of 0.01 nm to 10 nm, preferably, 1 nm to 3 nm. In the subsequent crystallization step, when a crystallizing method in which a metal element is added into a semiconductor film is used, gettering of the metal element is necessary. At this time, when the base insulating film is a silicon oxide film, in an interface between the silicon oxide film and a silicon film of the semiconductor film, the metal element in the silicon film and oxygen in the silicon oxide film reacts to be metal oxide, and the metal element is unlikely to be gettered in some cases. Thus, it is preferable that a layer including a silicon oxide film is not used for the base insulating film in contact with the semiconductor film.

Subsequently, the semiconductor film is formed in a thickness of 10 nm to 100 nm. A material of the semiconductor film can be selected according to the required characteristics of a TFT, and any one of a silicon film, a germanium film, and a silicon germanium film may be used. It is preferable to use as the semiconductor film a crystalline semiconductor film that is crystallized by a laser crystallization method using an excimer laser and the like after forming an amorphous semiconductor film or a microcrystal semiconductor film. The microcrystal semiconductor film can be obtained by performing glow discharge decomposition of silicide gas such as $SiH_4$. The microcrystal semiconductor film can be formed easily by diluting silicide gas with hydrogen or a rare gas element of fluorine.

In addition, it is also possible to apply a rapid thermal annealing (RTA) method using a halogen lump or a crystallization technique using a heating furnace as the crystallization technique. Further, a method in which a metal element such as nickel is added into an amorphous semiconductor film to have solid-phase growth of the added metal as a crystal nucleus may be used.

Then, an island-shaped semiconductor film 13 is formed by processing the semiconductor film by etching. A gate insulating film 14 is formed in a thickness of 10 nm to 200 nm, preferably 5 nm to 50 nm so as to cover the island-shaped semiconductor film 13.

The gate insulating film 14 may have a multilayer structure by appropriately combining any one of silicon oxide ($SiO_x$), silicon nitride ($SiN_x$), silicon oxynitride ($SiO_xN_y$) (x>y), or silicon nitride oxide ($SiN_xO_y$) (x>y) by a CVD method or a sputtering method. In this embodiment mode, the gate insulating film 14 has a multilayer structure of a silicon nitride oxide film and a silicon oxynitride film.

Subsequently, a first conductive film 15 and a second conductive film 16 each to be a gate electrode are formed over the gate insulating film 14. First, the first conductive film 15 is formed in a thickness of 5 nm to 50 nm. The first conductive film 15 can be formed of an aluminum (Al) film, a copper (Cu) film, a thin film containing aluminum or copper as its main component, a chromium (Cr) film, a tantalum (Ta) film, a tantalum nitride (TaN) film, a titanium (Ti) film, a tungsten (W) film, a molybdenum film, or the like. The second conductive film 16 is formed over the first conductive film 15 in a thickness of 150 nm to 500 nm. The second conductive film 16 can be formed of a chromium (Cr) film, a tantalum (Ta) film, a film containing tantalum as its main component, or the like, for example. However, the combination of the first conductive film 15 and the second conductive film 16 has to be selected on the condition that each of them can be etched at a certain selection ratio. As a combination of the first conductive film and the second conductive film that can be etched at a certain selection ratio, for example, the following combinations can be used: Al and Ta, Al and Ti, or TaN and W. In this embodiment mode, the first conductive film 15 is TaN and the second conductive film 16 is W.

Subsequently, a first resist 17 is formed over the second conductive film by photolithography with the use of a photo mask (FIG. 1A). The first resist 17 may be formed in a shape having a taper angle on the side surface. At the next first etching, a first gate electrode 18 having a taper angle θ can be formed by the first resist 17 having a taper angle. In addition, a reaction product at the first etching can be prevented from attaching to the side surface of the first resist 17 and from growing by having a taper angle on the side surface of the first resist 17. Further, the first resist 17, of which cross-sectional shape is symmetrical, having the same taper angles on both side surfaces of the resist may be formed by performing heat treatment to the first resist 17.

Figure 1B:
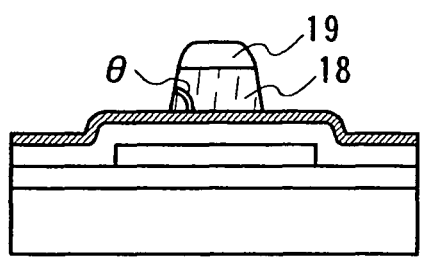

Subsequently, a first etching is performed by using the first resist 17 as a mask (FIG. 1B). At the first etching, the second conductive film 16 is etched and a first gate electrode 18 is formed from the second conductive film 16. At this time, it is preferable to perform etching under an etching condition of a high selection ratio with respect to the first conductive film 15 so that the first conductive film 15 is not etched. Note that the first resist 17 is also etched to be a second resist 19. However, a recess width of the first resist 17 to the second resist 19 is not shown in the figure. At this time, the side surface of the first gate electrode 18 has a taper angle θ of 80°≦θ≦90°, which is tapered at a taper angle of nearly 90°.

At the first etching, a mixed gas of $Cl_2$, $SF_6$, and $O_2$ is used as the etching gas, and the mixture ratio of $Cl_2/SF_6/O_2$ is 33/33/10 (sccm). Plasma is generated by adjusting a pressure at 0.67 Pa and applying power to obtain a voltage in ICP/Bias of 2000 W/50 W.

Figure 1C:
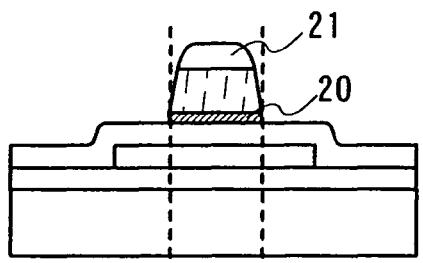

Subsequently, a second etching is performed to the first conductive film by using the first gate electrode 18 as a mask (FIG. 1C). Through the second etching, a second gate electrode 20 is formed from the first conductive film. At this time, it is preferable to perform etching under an etching condition of a high selection ratio with respect to the gate insulating film 14 so that the gate insulating film 14 is not etched. In the second etching condition, ICP/Bias is 2000 W/50 W, a pressure is 0.67 Pa, and an etching gas is $Cl_2$. Note that the second resist 19 is also recessed by etching to be a third resist 21; however, the recessed state is not shown in the figure.

Figure 1D:
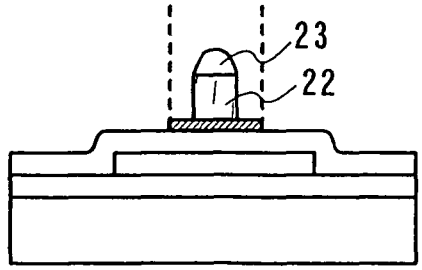

Next, a third etching is performed (FIG. 1D). In the third etching condition, ICP/Bias is 2000 W/0 W, a pressure is 1.33 Pa, and an etching gas is a mixed gas of $Cl_2$, $SF_6$, and $O_2$, of which mixture ratio of $Cl_2/SF_6/O_2$ is 22/22/30 (sccm). Through the third etching, while the third resist 21 is recessed, the gate length of the first gate electrode 18 is shortened and then a third gate electrode 22 is formed. Note that the recessed third resist 21 is to be a fourth resist 23. Thereafter, the fourth resist 23 is removed.

As another third etching condition, ICP/Bias may be 750 W/0 W, a pressure may be 0.67 Pa, an etching gas may be a mixed gas of $Cl_2$, $SF_6$, and $O_2$, of which mixture ratio of $Cl_2/SF_6/O_2$ is 20/100/30 (sccm). Under this condition, a selection ratio of W, which is a material of the first gate electrode, and the gate insulating film 14 gets higher; thus, the gate insulating film 14 can be suppressed from being etched during the third etching.

Under the above third etching, the side surface of the third gate electrode 22 is likely to be etched. When the side surface of the third gate electrode 22 is etched, the gate length in the middle gets shorter than that of the top surface or the bottom surface; thus, the cross-section of the third gate electrode has a shape constricted in the middle. Accordingly, the coverage of a film deposited over the third gate electrode 22 gets worse; thus, disconnection is likely to happen. In addition, since the third gate electrode is used as a doping mask in forming an LDD region, it is difficult to control the LDD length. This etching on the side surface of the third gate electrode 22 is a phenomenon that is occurred because the etching rate of the first gate electrode with respect to the etching rate of the resist is high. Therefore, in this embodiment mode, the etching rate of the first gate electrode is lowered by having a sample stage temperature at −10° C. or less; thus, the etching on the side surface of the third gate electrode 22 can be suppressed.

Through the above processes, a shape of a hat-shaped gate electrode is obtained. A hat-shaped structure of the present invention is obtained by using a resist recess width at etching. Specifically, the recess width of the third resist 21 to the fourth resist 23 at the third etching is identical with the difference between the gate length of the third gate electrode and that of the second gate electrode. In addition, the total of resist recess widths at the second and the third etching, in other words, the recess width of the second resist 19 to the fourth resist 23 is identical with the difference between the gate length of the third gate electrode and that of the second gate electrode.

According to a method for manufacturing a hat-shaped gate electrode of the present invention, the difference between the gate length of the second gate electrode and that of the third gate electrode can be 10 nm to 300 nm, preferably 50 nm to 200 nm; thus, an extremely minute gate electrode structure can be formed.

The first to third etching of this embodiment mode can be performed by dry etching and, specifically, an ICP (Inductively Coupled Plasma) method can be used.

Figure 2A:
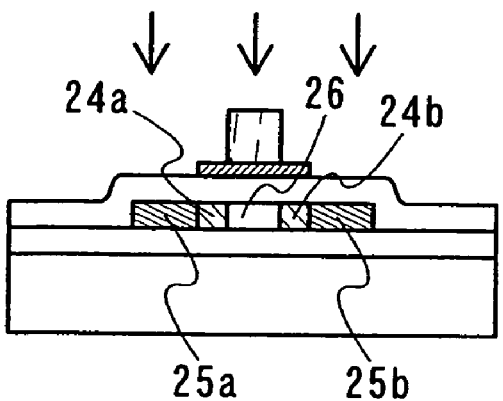
FIGS. 2A to 2C are views each showing Embodiment Mode 1 according to a certain aspect of the present invention.

Next, a first doping is performed to the island-shaped semiconductor film 13 (FIG. 2A). The island-shaped semiconductor film 13 is doped with a low-concentration impurity element through the second gate electrode and the gate insulating film to form low-concentration impurity regions 24a and 24b in the island-shaped semiconductor film overlapped with the second gate electrode. In addition, simultaneously, the both end parts of the island-shaped semiconductor film is also doped with an impurity element only through the gate insulating film to form low-concentration impurity regions 25a and 25b (FIG. 2A). Through the first doping, a channel-forming region 26 is also formed. The element concentrations of the low-concentration impurity regions 24a, 24b, 25a, and 25b are each $1\times10^{16}$ atoms/cm$^3$ to $1\times10^{20}$ atoms/cm$^3$ (preferably, $1\times10^{16}$ atoms/cm$^3$ to $5\times10^{18}$ atoms/cm$^3$). An ion doping method or an ion implantation method can be used as the doping method. For example, boron (B), gallium (Ga), or the like is used as the impurity element in manufacturing a p-type semiconductor, whereas phosphorus (P), arsenic (As), or the like is used as the impurity element in manufacturing an n-type semiconductor.

The doping to the low-concentration impurity regions 24a and 24b is performed not only through the gate insulating film but also through the second gate electrode 20. Therefore, the concentration of the impurity element of the low-concentration impurity regions 24a and 24b is lower than that of the low-concentration impurity regions 25a and 25b.

Figure 2B:
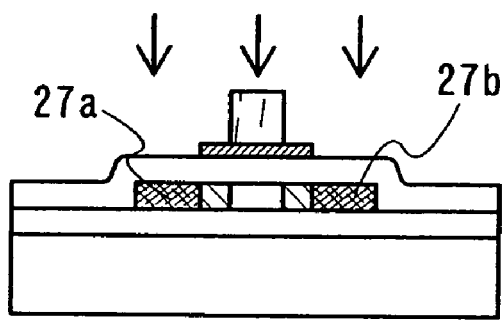

Then, a second doping is performed (FIG. 2B). Through the second doping, the low-concentration impurity regions 25a and 25b are doped with a high-concentration impurity element to form high-concentration impurity regions 27a and 27b selectively in the low-concentration impurity regions 24a, 24b, 25a, and 25b. The doping is performed so that the concentrations of the impurity elements in the high-concentration impurity regions 27a and 27b are each $1\times10^{19}$ atoms/cm$^3$ to $1\times10^{21}$ atoms/cm$^3$.

In this embodiment mode, the low-concentration impurity regions 24a and 24b overlapped with the second gate electrode are each formed through the gate insulating film as an LDD region to have a GOLD structure. Therefore, the semiconductor device manufactured in this embodiment mode can prevent the deterioration of the ON current value and thus high reliability can be realized. In addition, an LDD region of which LDD length is 10 μm to 300 μm, preferably 50 μm to 200 μm can be formed. Therefore, even in the case of an extremely minute TFT having the channel-forming region 26 of which channel length is 0.1 μm to 0.7 μm, an LDD region appropriate for its size can be formed.

Figure 2C:
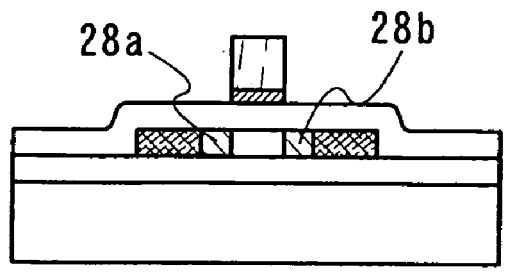

In order to form a Loff region from the state shown in FIG. 2B, the second gate electrode 20 is etched by using the third gate electrode 22 as a mask after the second doping. At this time, it is desirable to perform the etching under the above second etching condition. The second gate electrode of which gate length is longer that that of the third gate electrode 22 is partially etched; therefore, the low-concentration impurity regions 24a and 24b each formed as a Lov region are to be Loff regions 28a and 28b (FIG. 2C). Accordingly, a semiconductor device capable of suppressing leakage current, which is OFF current, and controlling short-channel effect can be obtained.

Figure 15A:
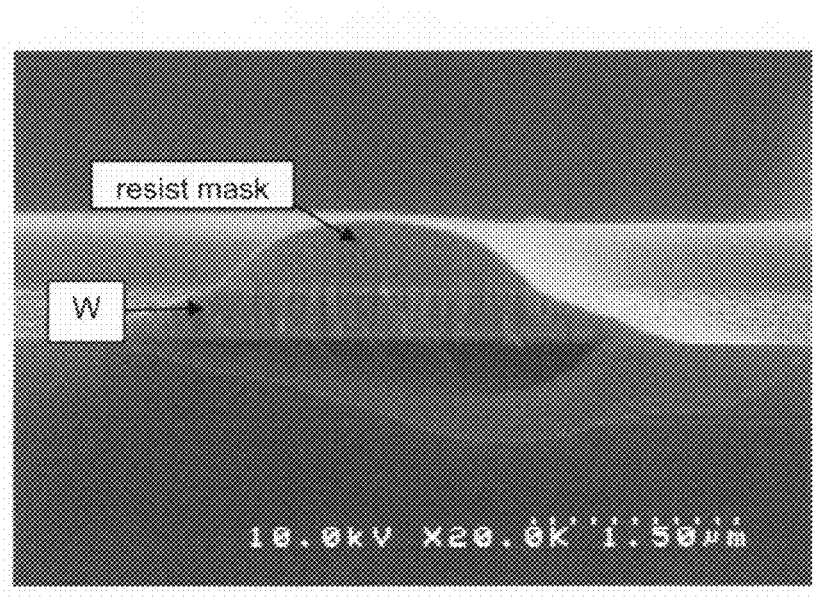
FIGS. 15A and 15B are SEM photographs each of a cross section of a hat-shaped gate electrode formed in a conventional method.
Figure 15B:
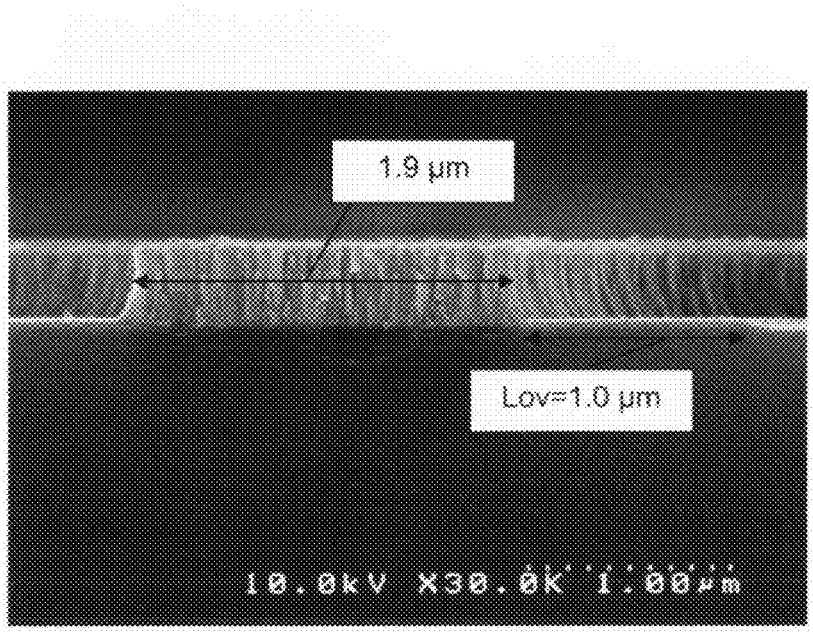

FIGS. 15A and 15B each show a SEM photograph of the cross-sectional shape of a hat-shaped gate electrode formed with a conventional method. On the other hand, FIGS. 16A and 16B each show a SEM photograph of the cross-sectional shape of a hat-shaped gate electrode formed according to the present invention.

FIG. 15A is in an etching state of the first and second conductive films by dry etching, which shows a tapered resist and a W film and a TaN film that are taper-etched. Since the TaN film is difficult to be distinguished, only the W film is marked. FIG. 15B, in which anisotropic etching of a W film is performed, shows a hat-shaped shape with the resist removed.

Figure 16A:
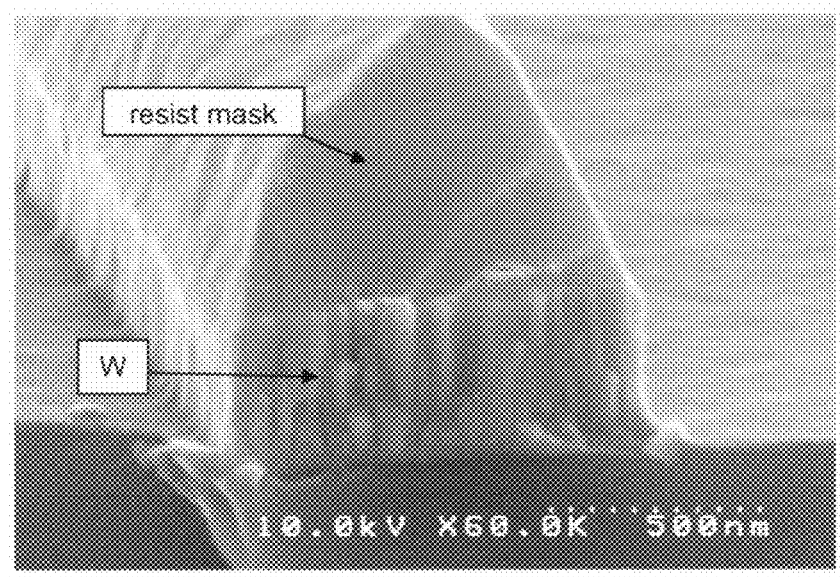
FIGS. 16A and 16B are SEM photographs each of a cross section of a hat-shaped gate electrode formed according to a certain aspect of the present invention.
Figure 16B:
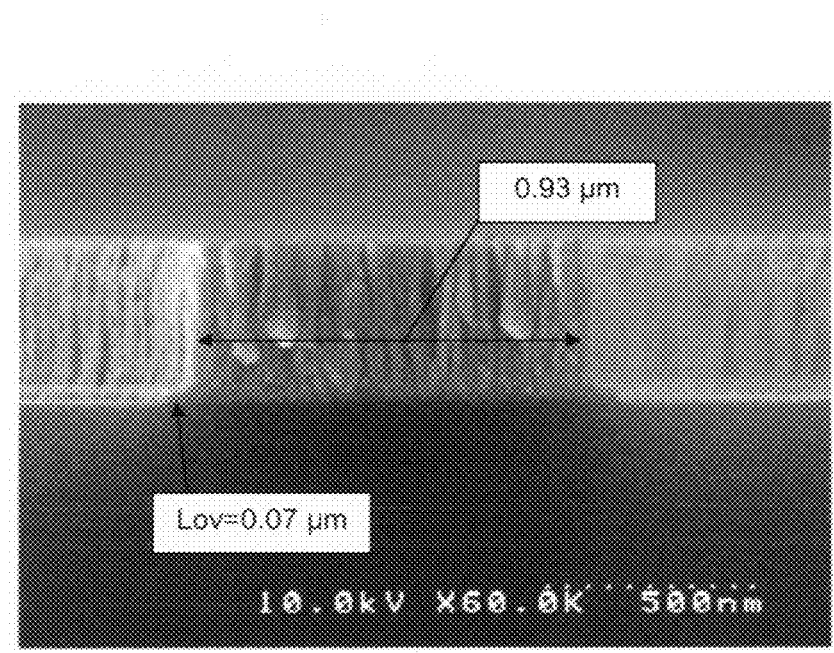

FIG. 16A is in an etching state of a W film by the first etching, which shows a resist and the W film. FIG. 16B, in which the third etching is performed, shows a hat-shaped shape with the resist removed.

As apparent from a contraction scale in the lower-right hand corner of the photograph, TFTs in FIGS. 15A and 15B are bigger in size than those in FIGS. 16A and 16B. The gate length is approximately 1.9 μm in FIG. 15B, whereas approximately 0.9 μm in FIG. 16B. The TFT in FIG. 16B has the gate length less-than half of that of the TFT in FIG. 15B.

In addition, the first conductive film (TaN) is extended much more toward a channel length direction than the second conductive film (W), of which length (hereinafter, referred to as a Lov length) is approximately 1 μm in FIG. 15B, whereas approximately 0.07 μm in FIG. 16B, of which difference is obvious. In the conventional method, a tapered part of the W film in FIG. 15A is long, which contributes to the Lov length directly; thus, the Lov length gets longer. On the other hand, the present invention has few tapered part of the W film as shown in FIG. 16A and the Lov length is formed by using the resist recess width without using the tapered part; therefore, the Lov length is extremely short.

Moreover, it is obvious that the side surface of the W film in FIG. 15B is warped to some extent and the side surface of the W film is etched. On the other hand, in FIG. 16B, the side surface of the W film is straight, which is not etched. This is because a sample stage temperature at the third etching is set lower to be −10° C. or less.

Figure 28A:
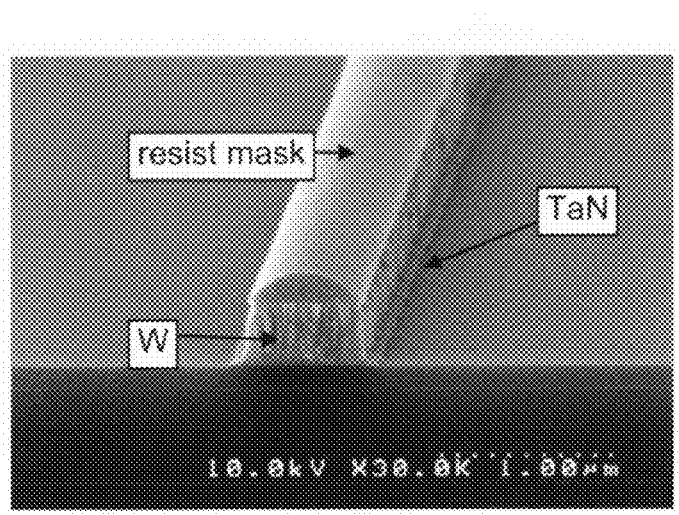
FIGS. 28A and 28B are SEM photographs each of a cross section of a hat-shaped gate electrode formed according to a certain aspect of the present invention.
Figure 28B:
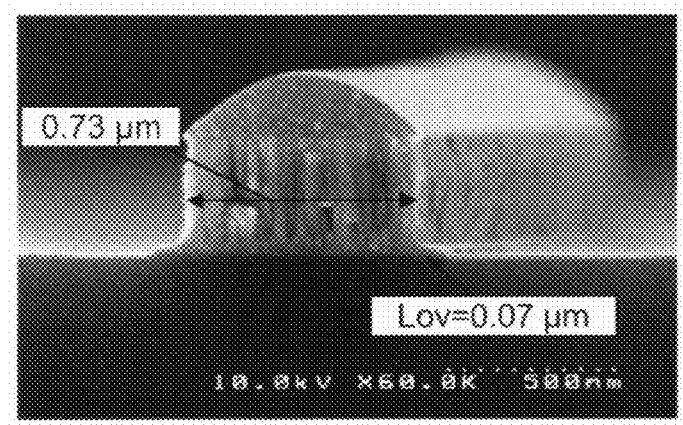

Further, FIGS. 28A and 28B each show a SEM photograph of a hat-shaped gate electrode formed according to the present invention. FIG. 28A shows a resist, a W film as the third gate electrode, and a TaN film as the second gate electrode. FIG. 28B is an enlarged view of FIG. 28A. The gate length of the third gate electrode formed of a W film is approximately 0.73 μm and the Lov length is approximately 0.07 μm.

Figure 29:
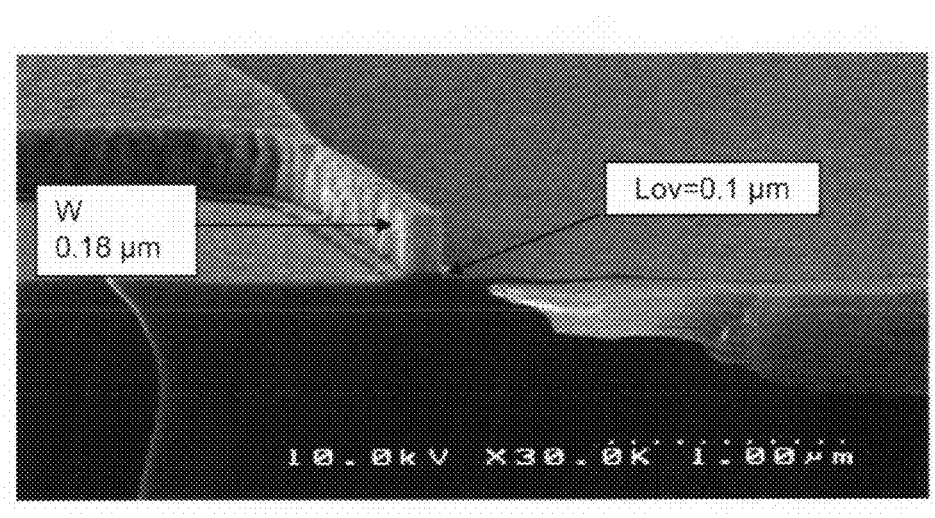
FIG. 29 is a SEM photograph of a cross section of a hat-shaped gate electrode formed according to a certain aspect of the present invention.

FIG. 29 shows a SEM photograph of a hat-shaped gate electrode with a short gate length. Herein, a W film as the third gate electrode and a TaN film as the second gate electrode are shown. The gate length of the third gate electrode formed of a W film is approximately 0.18 μm, which is capable of having an extremely minute structure. On the other hand, the Lov length is approximately 0.1 μm.

According to the present invention, the shape of the first resist 17 enables the Lov length to be controlled. The first resist 17 is easily etched by having a taper angle on the side surface compared with a resist of which taper angle is close to 90°. Therefore, the recess width of the resist by the third etching gets larger; thus, the Lov length can be made longer. Conversely, in the present invention, it is preferable to bring the taper angle of the first resist 17 on the side surface close to 90° when it is desired to shorten the Lov length.

As mentioned above, a semiconductor device including the TFTs manufactured according to this embodiment mode can have an LDD region with an extremely short LDD length; therefore, a semiconductor device with high reliability and little deterioration can be realized even in a miniaturized semiconductor device.

Embodiment Mode 2

Figure 3A:
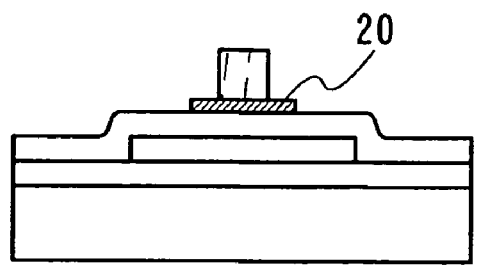
FIGS. 3A to 3C are views each showing Embodiment Mode 2 according to a certain aspect of the present invention.
Figure 3B:
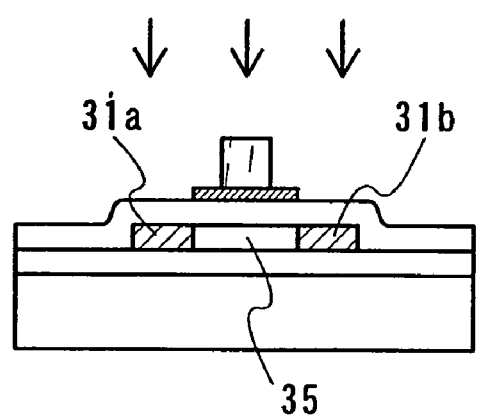
Figure 3C:
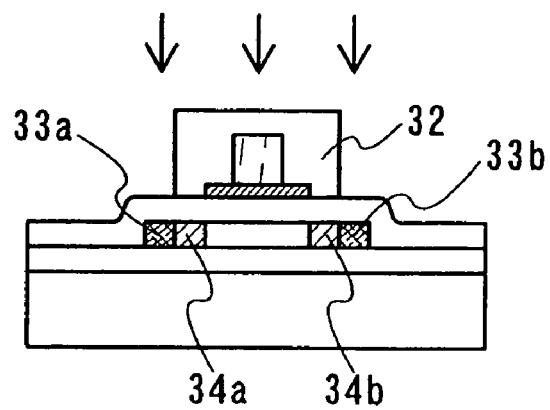

This embodiment mode shows a method for manufacturing a semiconductor device having a Loff region with reference to FIGS. 3A to 3C.

In this embodiment mode, a TFT having a hat-shaped gate electrode is formed in the same steps as Embodiment Mode 1 in FIGS. 1A to 1D to obtain a state shown in FIG. 3A.

Thereafter, the island-shaped semiconductor film not overlapped with the second gate electrode 20 is partially doped with an impurity element by performing a first doping using the second and the third gate electrodes as masks (FIG. 3B). Through this doping, low-concentration impurity regions 31a and 31b and a channel-forming region 35 are formed. The doping is performed so that the concentrations of the impurity elements in the low-concentration impurity regions 31a and 31b are each $1\times10^{16}$ atoms/cm$^3$ to $1\times10^{20}$ atoms/cm$^3$, preferably $1\times10^{16}$ atoms/cm$^3$ to $5\times10^{18}$ atoms/cm$^3$.

Next, a second doping for forming high-concentration impurity regions is performed (FIG. 3C). A resist 32 is formed so that the low-concentration impurity regions 31a and 31b are not doped totally with a high-concentration impurity element. The resist 32 is formed to cover part of the low-concentration impurity regions 31a and 31b. The impurity element is doped by using the resist 32 as a mask so that the concentrations in high-concentration impurity regions 33a and 33b are each $1\times10^{19}$ atoms/cm$^3$ to $1\times10^{21}$ atoms/cm$^3$. Consequently, the high-concentration impurity regions 33a and 33b, low-concentration impurity regions 34a and 34b are each formed in the low-concentration impurity regions 31a and 31b. Thereafter, the resist 32 is removed.

As mentioned above, a semiconductor device including the TFT manufactured according to this embodiment mode can have the low-concentration impurity regions 34a and 34b each as a Loff region, and leakage current which is OFF current can be suppressed and thus short-channel effect can be controlled even in a miniaturized semiconductor device.

The TFT manufactured according to this embodiment mode has an LDD region of a Loff region in the same manner as FIG. 2C. The method for manufacturing a Loff region shown in FIG. 2C has an advantage that the number of processing steps is fewer, whereas short channel effect is increased to some extent because the channel length of the channel-forming region gets shorter.

Embodiment Mode 3

Figure 4A:
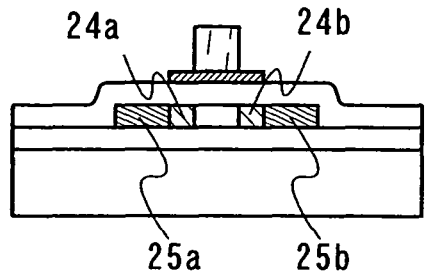
FIGS. 4A to 4D are views each showing Embodiment Mode 3 according to a certain aspect of the present invention.

This embodiment mode explains a method for manufacturing a semiconductor device having-both a Lov region and a Loff region with reference to FIGS. 4A to 4D. In this embodiment mode, a TFT having a hat-shaped gate electrode and an impurity region is formed in the same steps as Embodiment Mode 1 in FIGS. 1A to 2A (FIG. 4A).

Figure 4B:
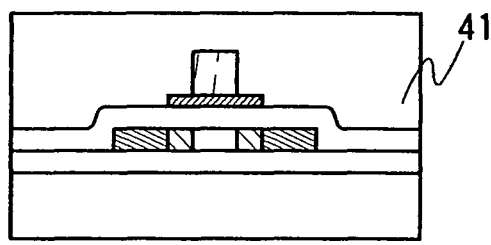
Figure 4C:
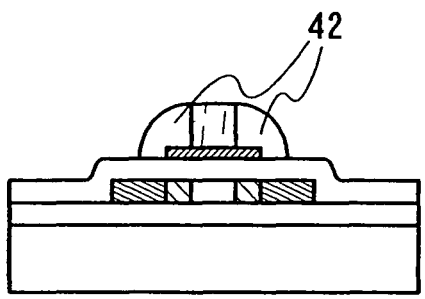

Next, a film 41 formed from a silicon compound is formed over the gate electrode in 100 nm thick by using a known film forming method (FIG. 4B). In this embodiment mode, a silicon oxide film is used as the film 41. Then, sidewalls 42 shown in FIG. 4C are formed by etching back the film 41 formed from a silicon compound. When the difference between the gate length of the second gate electrode and that of the third gate electrode is extremely small, the sidewalls 42 are formed so that not only the side surfaces of the third gate electrode but also those of the second gate electrode are covered.

Figure 4D:
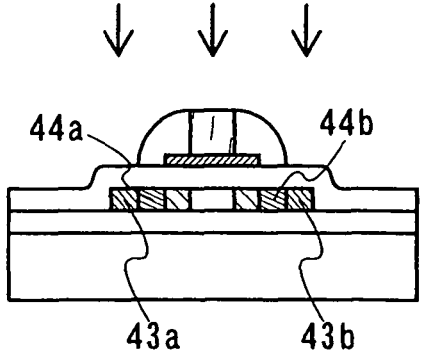

Then, a second doping is performed as shown in FIG. 4D. The second doping is performed by using the sidewalls 42 and the third gate electrode as masks. Accordingly, high-concentration impurity regions 43a and 43b are formed in part of the low-concentration impurity regions 25a and 25b that are not covered with the sidewalls 42. Simultaneously, low-concentration impurity regions 44a and 44b that are each to be a Loff region are also formed. In addition, the low-concentration impurity regions 24a and 24b are each to be a Lov region.

Through the above processes, in a semiconductor device including the TFT manufactured according to this embodiment mode, a TFT having a Loff region and a Lov region can be realized. Therefore, short-channel effect can be controlled and the deterioration of ON current value can be prevented even in a miniaturized semiconductor device.

Figure 17A:
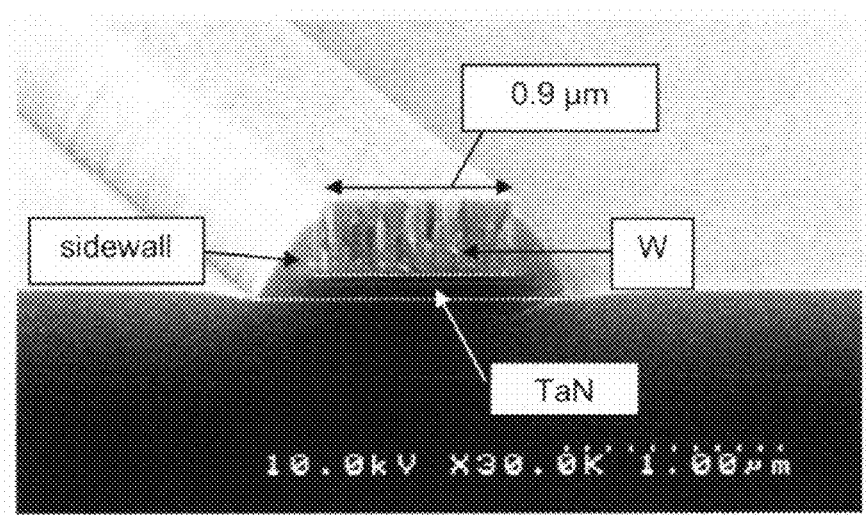
FIGS. 17A and 17B are SEM photographs each of a cross section of a hat-shaped gate electrode formed in Embodiment Mode 3 according to a certain aspect of the present invention.
Figure 17B:
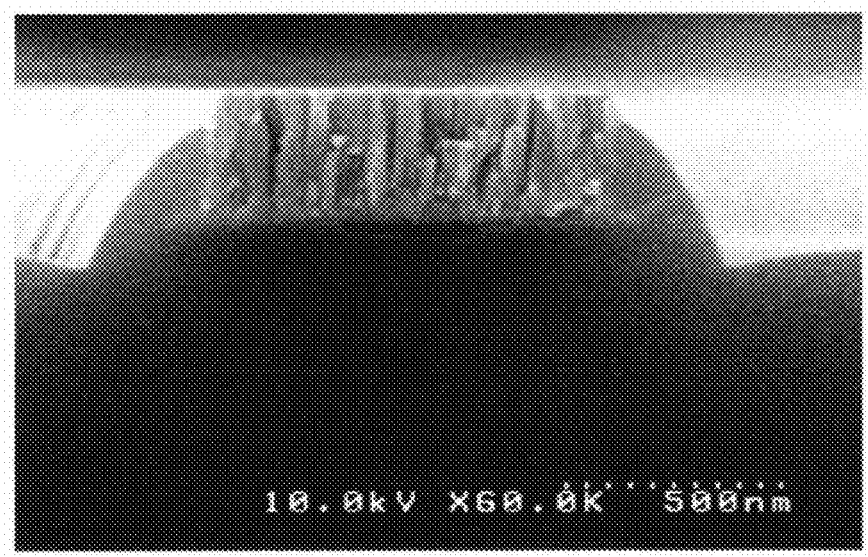
Figure 18A:
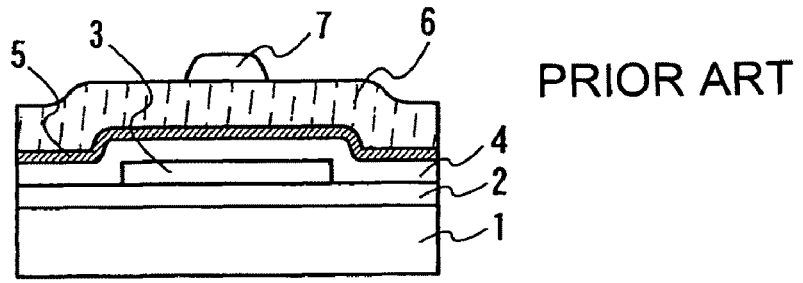
FIGS. 18A to 18D are views each showing a conventional example.
Figure 18B:
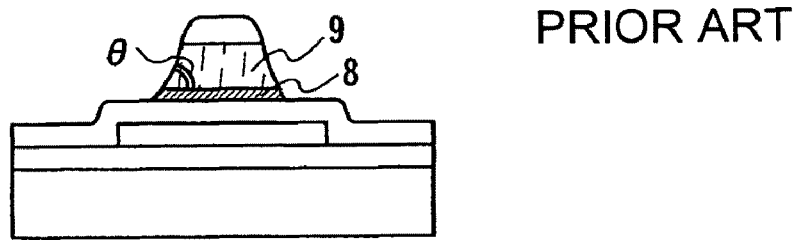
Figure 18C:
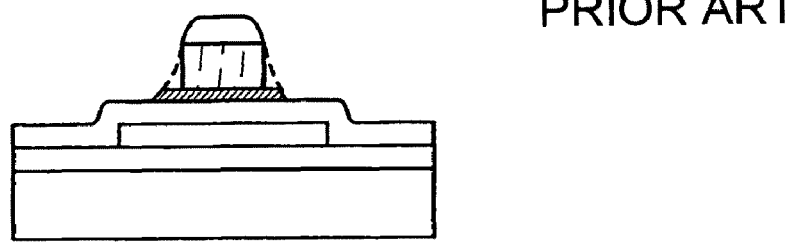
Figure 18D:
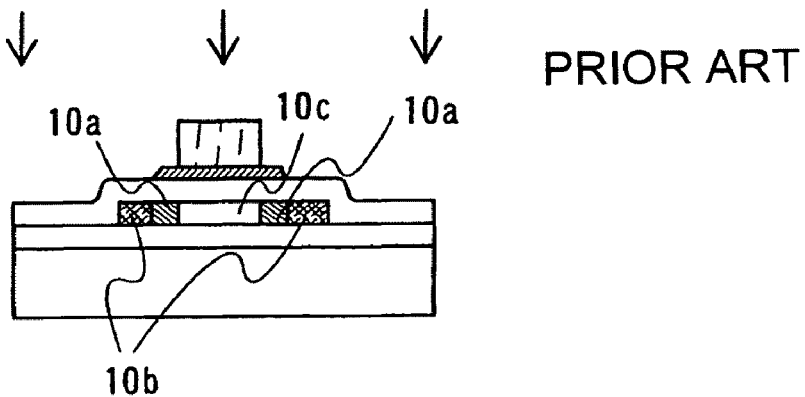

FIGS. 17A and 17B each show a SEM cross-sectional photograph of a hat-shaped gate electrode with the sidewalls explained in this embodiment mode formed. FIG. 17A is a SEM photograph of the cross section which is taken obliquely, whereas FIG. 17B is a photograph that further enlarged the magnification of FIG. 17A. The gate length of the third gate electrode formed from W is 0.9 μm, which is an extremely short gate length. It is difficult from the photographs to determine the boundary to show where a TaN film is in contact with the sidewalls. However, it can be confirmed that the sidewalls are formed so that the side surfaces of the second gate electrode formed of a TaN film are covered as like as the sidewalls 42 shown in this embodiment mode. In addition, it can be confirmed that the upper portions of a W film on the side surfaces, which are part of a W film on the side surfaces, are not covered with the sidewalls.

Embodiment Mode 4

This embodiment mode explains a method for manufacturing a display device using TFTs of various structures explained in Embodiment Mode 1 to Embodiment Mode 3 with reference to FIGS. 5A to 5C, FIGS. 6A to 6C, FIGS. 7A to 7C, and FIGS. 8A to 8C. According to the method for manufacturing a display device explained in this embodiment mode, TFTs in a pixel portion and its peripheral driver circuit portion are formed simultaneously. Note that this embodiment mode can be arbitrarily combined with Embodiment Mode 1 to Embodiment Mode 3 within the range of enablement.

Figure 5A:
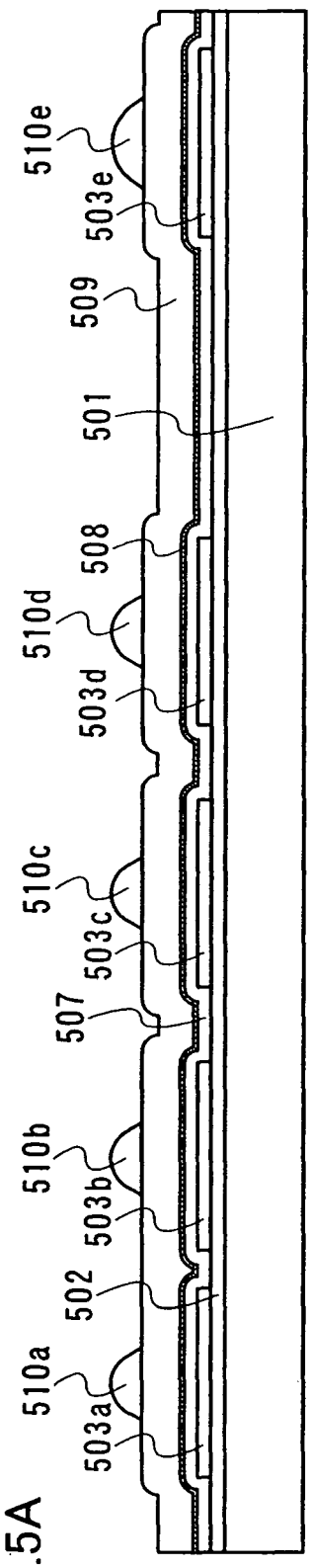
FIGS. 5A to 5C are views each showing Embodiment Mode 4 according to a certain aspect of the present invention.

First, a substrate 501 of which surface is provided with a base insulating film 502 is prepared as shown in FIG. 5A. The substrate and the base insulating film can be the one each mentioned in Embodiment Mode 1. In this embodiment mode, the base insulating film, which has stacked layers of a silicon oxide film in a 50 nm thick and a silicon nitride oxide film in 100 nm thick, is formed over a glass substrate. Needless to say, elements may be directly formed on the substrate without providing the base insulating film.

Next, an amorphous silicon film in 66 nm thick is formed by a known deposition method over the base insulating film 502. Note that the present invention is not limited to an amorphous silicon film, and it is sufficient that an amorphous semiconductor film (including a microcrystal semiconductor film) is formed. Further, a compound semiconductor film having an amorphous structure such as an amorphous silicon germanium film may be used as well.

Then, the amorphous silicon film is crystallized by a laser crystallization method. Needless to say, not only the laser crystallization method, but also a thermal crystallization method by with the use of RTA or an annealing furnace, a thermal crystallization method using metal elements for promoting the crystallization, or the like may be combined as well.

The amorphous semiconductor film is crystallized by the above laser crystallization to have a crystalline semiconductor film. Then, the crystalline semiconductor film is processed into a desired shape to form island-shaped semiconductor films 503a to 503e. Note that channel doping may be performed to the island-shaped semiconductor films 503a to 503e if necessary to control the threshold voltage of TFTs.

Then, a gate insulating film 507 for covering the island-shaped semiconductor films 503a to 503e is formed. The gate insulating film 507 is formed by a plasma CVD method or a sputtering method in a thickness of 5 nm to 100 nm using an insulating film containing silicon. In this embodiment mode, a silicon oxynitride film is formed by a plasma CVD method to be in contact with the island-shaped semiconductor films and further a silicon nitride film is stacked thereover. Needless to say, the gate insulating film is not limited to the multilayer of this embodiment mode, and other insulating films containing silicon may be stacked in a single layer or multilayer structure.

In addition, in the case of using a silicon oxide film, the silicon oxide film can be formed by a plasma CVD method with the mixture of TEOS (Tetraethyl Orthosilicate) and $O_2$ in the condition of a reaction pressure at 40 Pa, a substrate temperature at 300° C. to 400° C., an RF (13.56 MHz) power density of 0.5 W/cm$^2$ to 0.8 W/cm$^2$ to be discharged. The silicon oxide film formed in this manner can provide favorable characteristics as the gate insulating film by applying thermal annealing at temperatures 400° C. to 500° C., subsequently.

Subsequently, a first conductive film 508 and a second conductive film 509 each to be a gate electrode are formed over the gate insulating film 507. First, the first conductive film 508 is formed in a thickness of 5 nm to 50 nm, and the second conductive film 509 is formed in a thickness of 150 nm to 500 nm. The first conductive film 508 and the second conductive film 509 can be formed by using the same materials as those described in Embodiment Mode 1, and in this embodiment mode, TaN and W are used as the combination of the first conductive film and the second conductive film.

Resists 510a to 510e can be manufactured over the second conductive film by using a well-known method (FIG. 5A).

Figure 5B:
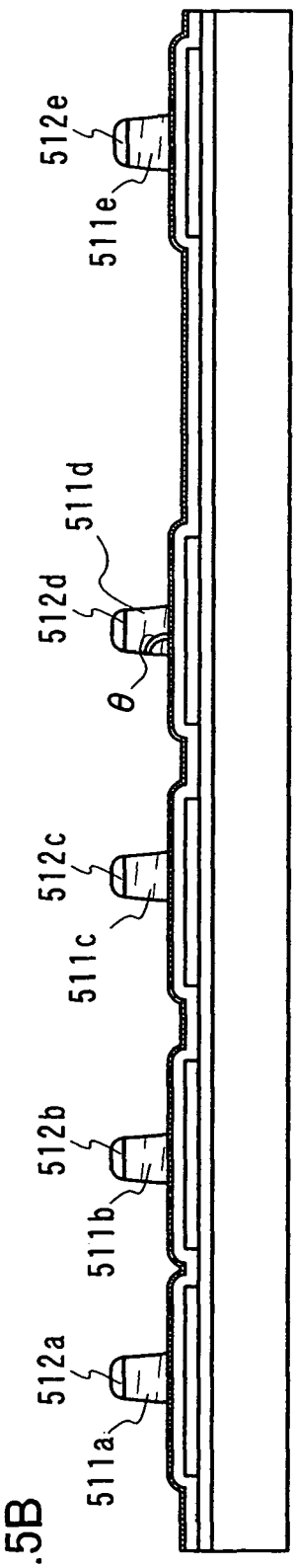

Subsequently, a first etching is performed (see FIG. 5B). Through the first etching, the second conductive film 509 is etched by using the resists 510a to 510e as masks to form first gate electrodes 511a to 511e. The etching is performed so that a taper angle θ of the first gate electrodes 511a to 511e on each of the side surfaces is 80°≦θ≦90°, and a side surface of nearly 90° is obtained. At this time, the resists 510a to 510e are also etched to be resists 512a to 512e.

Figure 5C:
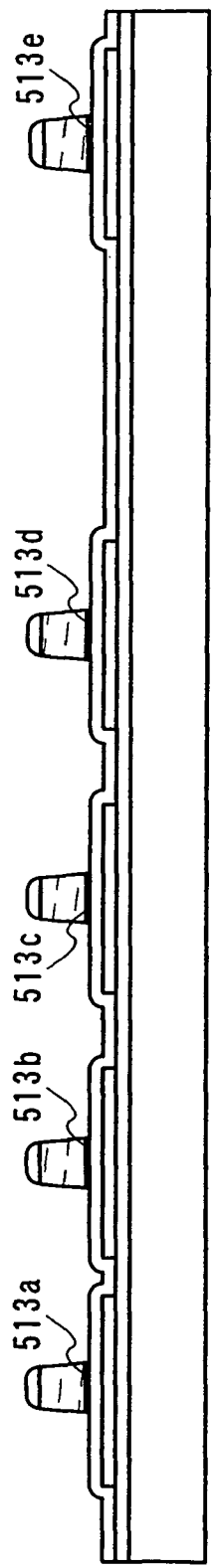

Subsequently, a second etching is performed as shown in FIG. 5C. The first conductive film 508 is etched by using the first gate electrodes 511a to 511e as masks to form second gate electrodes 513a to 513e. Note that, at this time, the resists 512a to 512e are also etched to some extent.

Then, a third etching is performed. Through the third etching, the resists 512a to 512e are recessed and then each gate length of the first gate electrodes 511a to 511e is recessed by using the recessed resists 512a to 512e as masks. Accordingly, third gate electrodes 514a to 514e of which gate length is shorter than that of the second gate electrodes are formed as shown in FIG. 6A. The resists 512a to 512e are also recessed to be resists 515a to 515e. Through the first to third etching mentioned above, the gate electrodes each has a hat-shaped structure.

The first to third etching in this embodiment mode can be performed by a dry etching method, and specifically, an ICP (Inductively Coupled Plasma) etching method can be used.

Then, a first doping is performed. The first doping is performed in a self-aligned manner by using the resists 515a to 515e and the third gate electrodes 514a to 514e as masks to add a low-concentration n-type impurity element (phosphorus in this embodiment mode). It is preferable that low-concentration impurity regions 601a to 601e that are each overlapped with the second gate electrode and low-concentration impurity regions 602a to 602e that are each not overlapped with the second gate electrode both through the gate insulating film are added with phosphorus at a concentration of $1 \times 10^{16}$ atoms/cm$^3$ to $5 \times 10^{18}$ atoms/cm$^3$ (typically, $3 \times 10^{17}$ atoms/cm$^3$ to $3 \times 10^{18}$ atoms/cm$^3$). However, since the low-concentration impurity regions 601a to 601e are each doped through the second gate electrode, the concentration of the impurity element is lower than that contained in the low-concentration impurity regions 602a to 602e.

Then, a second doping is performed as shown in FIG. 6B. Before that, a resist 604 is formed so that the low-concentration impurity regions 601c and 602c are not doped with a high-concentration impurity element. The second doping is performed in a self-aligned manner by using the resist 604; the resists 515a, 515b, 515d, and 515e; the third gate electrodes 514a, 514b, 514d, and 514e; and the second gate electrodes 513a, 513b, 513d, and 513e as masks to add a high-concentration n-type impurity element (phosphorus in this embodiment mode) selectively into the low-concentration impurity regions. It is preferable that high-concentration impurity regions 603a to 603d thus formed are added with phosphorus at a concentration of $1\times10^{20}$ atoms/cm$^3$ to $5\times10^{21}$ atoms/cm$^3$ (typically, $2\times10^{20}$ atoms/cm$^3$ to $5\times10^{21}$ atoms/cm$^3$).

Then, a resist 606 is formed as shown in FIG. 6C by removing the resist 604 and the resists 515a to 515e. Then, a fourth etching as shown in FIG. 2C of Embodiment Mode 1 is performed. Second gate electrodes 605a, 605b, and 605c are obtained by partially etching the second gate electrodes 513a, 513d, and 513e. Thereafter, the resist 606 is removed.

Note that, when the fourth etching is performed after forming the resist 606 without removing the resists 515a to 515e, the etching is performed using Cl$_2$ as an etching gas with the condition of an internal pressure of the chamber at 0.67 Pa by means of an evacuation system and ICP/Bias to be 2000 W/50 W.

Subsequently, a resist 701 is formed, and a third doping is performed (FIG. 7A). Through the third doping, the high-concentration impurity regions 603a and 603d and the low-concentration impurity regions 601a and 601e that have been the n-type impurity regions are doped with a p-type impurity element (boron in this embodiment mode) at a concentration of $3\times10^{20}$ atoms/cm$^3$ to $3\times10^{21}$ atoms/cm$^3$ (typically, $5\times10^{20}$ atoms/cm$^3$ to $1\times10^{21}$ atoms/cm$^3$) by an ion doping method using diborane (B$_2$H$_6$). Therefore, impurity regions 702 and 703 containing boron at a high concentration are formed. In this manner, the impurity regions 702 and 703 each function as a source region and a drain region of a p-channel TFT.

Then, the resist 701 is removed as shown in FIG. 7B. Thereafter, sidewalls 704a to 704e are formed on both sides of the second gate electrodes 605a to 605c, 513b, and 513c, and the third gate electrodes 514a to 514e. The sidewalls 704a to 704e are formed by being etched back after forming a silicon compound film as shown in Embodiment Mode 3.

Then, a resist 705 is formed, and a fourth doping is performed subsequently. Through the fourth doping, an impurity element is added into part of the n-type low-concentration impurity region 602c by using the resist 705, the sidewalls 704c, and the third gate electrode 514c as masks. Phosphorus (PH$_3$) is used as the impurity element, and a high-concentration n-type impurity element (phosphorus in this embodiment mode) is added by an ion doping method at a concentration of $3\times10^{20}$ atoms/cm$^3$ to $3\times10^{21}$ atoms/cm$^3$ (typically, $5\times10^{20}$ atoms/cm$^3$ to $1\times10^{21}$ atoms/cm$^3$); thus, an impurity region 706 containing phosphorus at a high concentration is formed. Simultaneously, a low-concentration impurity region 707 to be a Loff region is formed. The low-concentration impurity region 601c is to be a Lov region.

Thereafter, the n-type or p-type impurity element that is added at each concentration is activated. The activation is performed by a laser annealing method. In the case of using a laser annealing method, the laser used in crystallization can be used again.

Figure 8A:
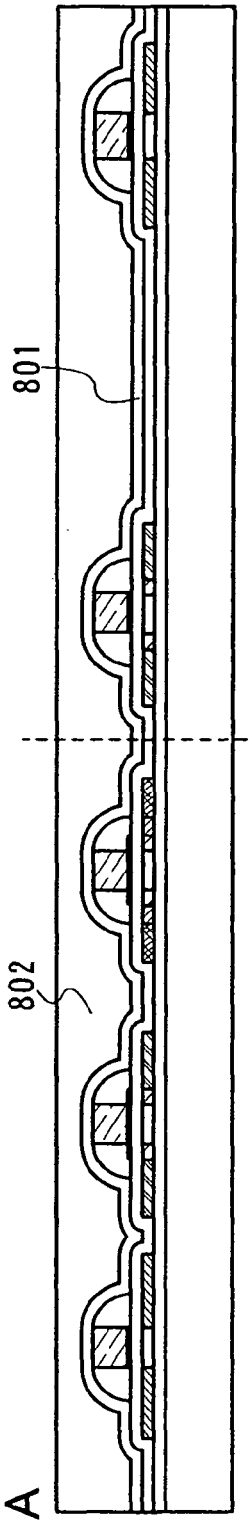
FIGS. 8A to 8C are views each showing Embodiment Mode 4 according to a certain aspect of the present invention.

Then, a passivation film 801 is formed in a thickness of 50 nm to 500 nm (typically, 200 nm to 300 nm) as a protective film as shown in FIG. 8A. This can be substituted with a silicon oxide film, a silicon nitride film, a silicon nitride oxide film, or a multilayer of these films. Blocking effect for preventing penetration of impurities of various ions including moisture within oxygen or an atmosphere can be obtained by providing the passivation film 801.

Then, an interlayer insulating film 802 is formed in 1.6 μm thick over the passivation film 801. The interlayer insulating film 802 can be formed by using the following films that are formed by an SOG (Spin On Glass) method or a spin coating method: an organic resin film such as polyimide, polyamide, BCB (benzocyclobutene), acrylic, or siloxane (siloxane is composed of a skeleton structure formed by the bond of silicon (Si) and oxygen (O), in which an organic group at least containing hydrogen (such as an alkyl group or aromatic hydrocarbon) is included as a substituent, where a fluoro group or a fluoro group and an organic group at least containing hydrogen may be used alternatively as the substituent); an inorganic interlayer insulating film (an insulating film containing silicon such as silicon nitride or silicon oxide); or a film such as formed from a low-k (low dielectric constant) material. The interlayer insulating film 802 is preferable to be a film superior in terms of planarity because the interlayer insulating film 802 alleviates unevenness caused due to TFTs formed over the glass substrate and thus has great significance of planarity. Thereafter, a passivation film may be further formed over the interlayer insulating film.

Figure 8B:
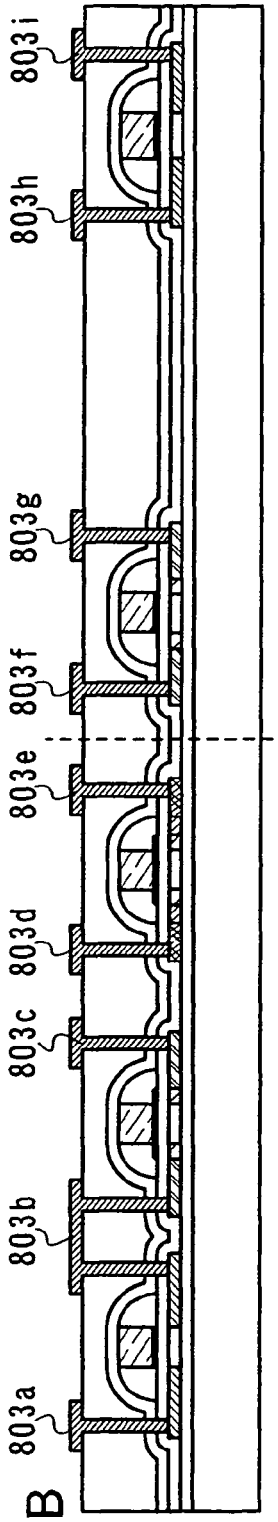

Then, as shown in FIG. 8B, contact holes are formed in the gate insulating film 507, the passivation film 801, and the interlayer insulating film 802 to form source and drain wirings 803a to 803i. Note that, in this embodiment, the source and drain wirings each have a three-layer structure of a titanium film, a first aluminum film, and a second aluminum film containing carbon and a metal element or a three-layer structure of a molybdenum film, a first aluminum film, and a second aluminum film containing carbon and a metal element. The first aluminum film may be the one mixed with other metal element. Titanium, molybdenum, or nickel is given as an example of the metal element contained in the second aluminum film. Needless to say, other metal may be used for the source and drain wirings instead of the above metals.

Subsequently, a pixel electrode 804 is formed to be in contact with the drain wiring 803h. The pixel electrode 804 is formed by etching a transparent conductive film. The transparent conductive film can be a compound of indium oxide and tin oxide, a compound of indium oxide and zinc oxide, zinc oxide, tin oxide, or indium oxide.

When the pixel electrode 804 is formed of a transparent conductive film and the drain wiring 803h is formed of an aluminum film, the oxide of aluminum is formed in the interface. Since the oxide of aluminum has high resistance, large resistance is caused between the pixel electrode 804 and the drain wiring 803h. However, in this embodiment mode, the layer of the drain wiring 803h in contact with the pixel electrode 804 is the second aluminum film; therefore, the oxide of aluminum is not formed. This is because the metal element contained in the second aluminum film suppresses the oxide to be formed. Accordingly, the resistance in the interface between the drain wiring 803h and the pixel electrode 804 can be kept low.

After forming the pixel electrode, a bank 805 is formed by using a resin material. The bank 805 is formed by etching an acrylic film or a polyimide film in a thickness of 1 μm to 2 μm so that part of the pixel electrode 804 is exposed. Note that a black film to serve as a black shielding film (not shown) may be provided appropriately under the bank 805.

Then, an EL (Electro Luminescence) layer 806 and an electrode (MgAg electrode) 807 are formed continuously by a vacuum vapor deposition method without being exposed to an atmosphere. Note that it is desirable to form the EL layer 806 in a thickness of 100 nm to 1 μm and the electrode 807 in a thickness of 180 nm to 300 nm (typically, 200 nm to 250 nm). The EL layer may be formed by an ink-jet method, a screen-printing method, or the like as well.

In this step, an EL layer and a cathode are formed in each pixel corresponding to red, green, and blue. However, it is necessary to form the EL layer individually for each color without using a photolithography technique because the EL layer has low resistance to a solution. Therefore, it is preferable to cover pixels other than the predetermined pixels with a metal mask to form an EL layer and a cathode selectively in necessary portions. At least one of each color is colored with a triplet compound. Since the triplet compound has higher luminance than a singlet compound, it is preferable that a triplet compound is used to form a pixel corresponding to red that looks dark, and a singlet compound is used to form other pixels.

In other words, a mask for covering all pixels other than the pixels corresponding to red is set to a vapor deposition apparatus, and an EL layer for red emission and an electrode are selectively formed with the use of the mask by a vapor deposition method. Next, a mask for covering all pixels other than the pixels corresponding to green is set to a vapor deposition apparatus, and an EL layer for green emission and an electrode are selectively formed with the use of the mask by a vapor deposition method. Then, a mask for covering all pixels other than the pixels corresponding to blue is set to a vapor deposition apparatus, and an EL layer for blue emission and an electrode are selectively formed with the use of the mask by a vapor deposition method. Note that different masks are used for each color in this description; however, the same mask may be used. In addition, it is preferable to maintain vacuum until the EL layers and the electrodes in the whole pixels.

Note that the EL layer 806 may be formed of a known material. It is preferable to use an organic material as a known material in consideration of a drive voltage. For example, an EL layer having a four-layer structure of a hole-injecting layer, a hole-transporting layer, a light-emitting layer, and an electron-injecting layer is preferably formed. A film in which molybdenum oxide and α-NPD are mixed ($OMO_x$) may also be used for the EL layer. Alternatively, a hybrid layer in which an organic material and an inorganic material are combined may also be used for the EL layer. In the case of using an organic material for the EL layer, each of a low molecular weight material, a middle molecular weight material, and a high molecular weight material can be used. In addition, this embodiment mode shows the example of using MgAg electrode as a cathode of the EL element; however, other known materials may also be used.

Upon forming up to the electrode 807, a light-emitting element 808 is completed. Thereafter, a protective films; 809 is provided so as to cover the light-emitting element 808 completely. The; protective layer 809 can be formed of an insulating film including a carbon film, a silicon nitride film, or a silicon nitride oxide film. Such insulating films can be stacked in a single layer or a multilayer.

Further, a sealing material 810 is provided to cover the protective film 809, and a cover member 811 is attached thereto. The sealing material 810 is an ultraviolet light curable resin, which preferably contains inside a hygroscopic substance or an antioxidant substance. Furthermore, in this embodiment mode, a glass substrate, a quartz substrate, or a plastic substrate can be used for the cover member 811. Although not shown in the drawing, a polarizing plate may be provided between the sealing material 810 and the cover member 811. The polarizing plate is provided; thus, high-contrast display can be provided.

Figure 8C:
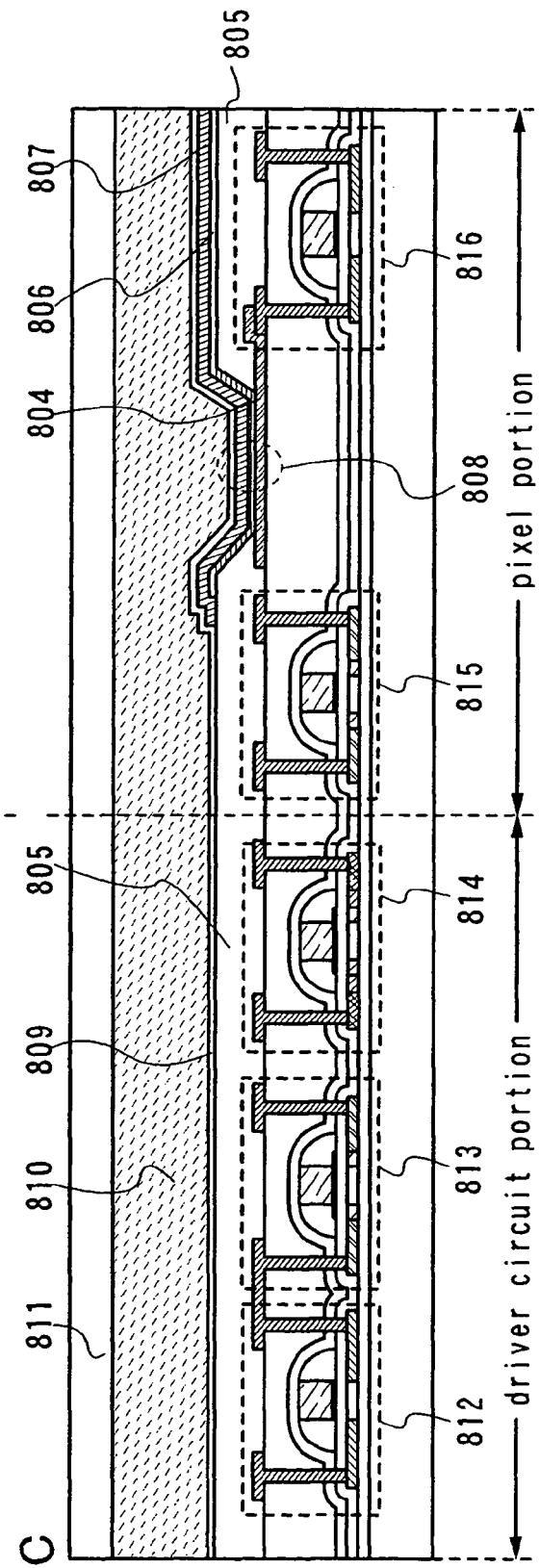

In this manner, as shown in FIG. 8C, an active matrix EL display device having as its structure a p-channel TFT 812, an n-channel TFT 813, a sampling circuit TFT 814, a switching TFT 815, and a current-controlling TFT 816 is completed. In this embodiment mode, the p-channel TFT 812 and the current-controlling TFT 816 each without an LDD region, the n-channel TFT 813 having a Lov region, the switching TFT 815 having a Loff region, and the sampling circuit TFT 814 having both a Loff region and a Lov region can be formed simultaneously over one substrate. Note that the p-channel TFTs 812 and 816 have little hot carrier effect and have little short channel effect; therefore, an LDD region is not provided in this embodiment. However, as like in other n-channel TFTs, a p-channel TFT can be provided appropriately with an LDD region by doping a p-type impurity element with the use of a gate electrode or sidewalls as a mask. As for the method, p-channel TFTs having each structure can be formed by referring to a method for forming the n-channel TFTs of this embodiment mode and using a p-type impurity element as a doping element.

In addition, the Loff region of this embodiment mode is formed through the method shown in FIG. 2D of Embodiment Mode 1; however, the Loff region may be provided through the method shown in Embodiment Mode 2.

This embodiment mode explains a bottom-emission EL display device in which a pixel electrode is a transparent conductive film and the other electrode is a MgAg electrode. However, the present invention is not limited to this structure, a top-emission EL display device may be manufactured by forming a pixel electrode from a light-shielding material and forming the other electrode from a transparent conductive film. In addition, a dual-emission EL display device may be manufactured by forming the both electrodes from a transparent conductive film.

Figure 9:
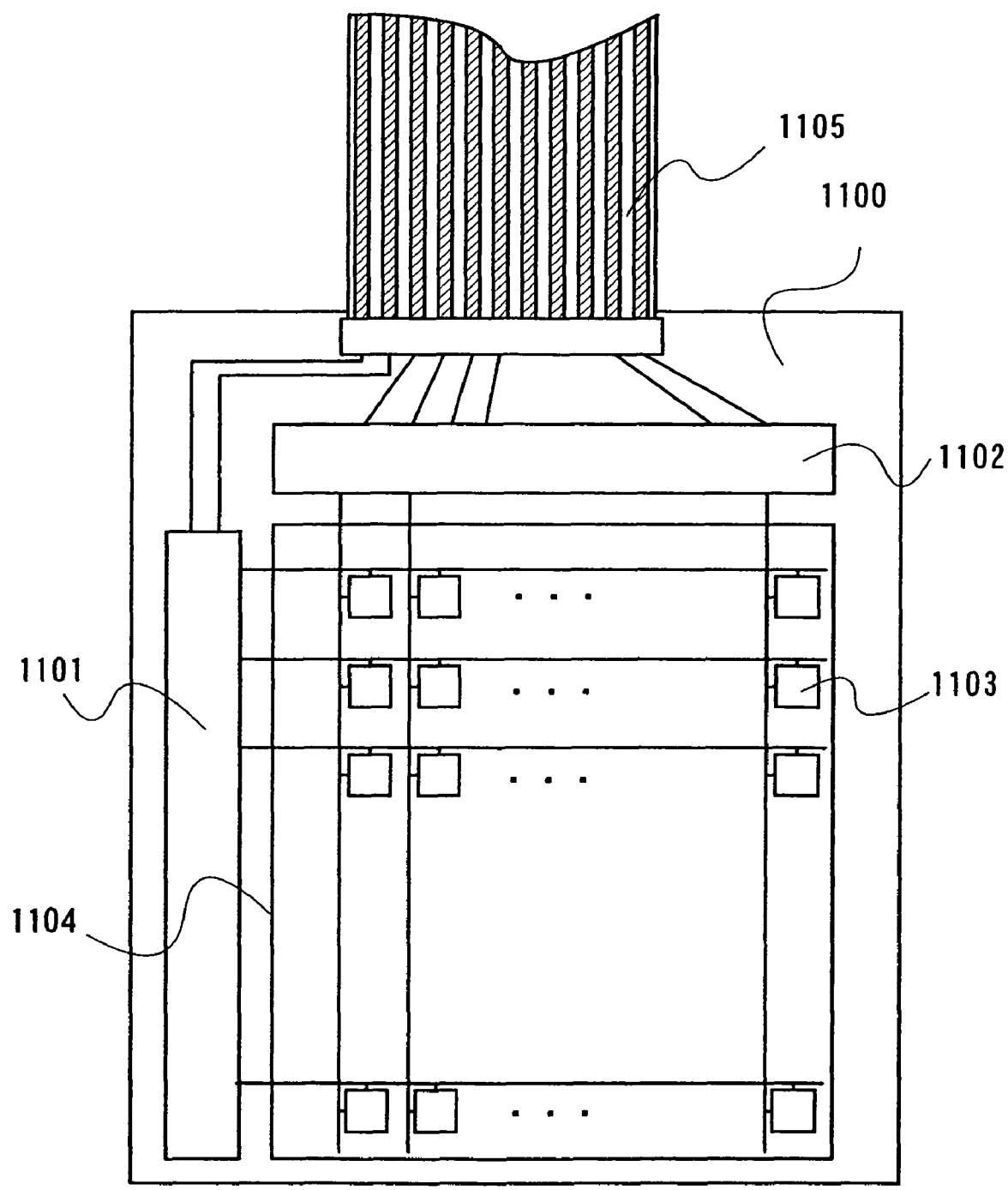
FIG. 9 is a view showing Embodiment Mode 4 according to a certain aspect of the present invention.

FIG. 9 shows a schematic view of a display device. A gate-signal line driver circuit 1101, a source-signal line driver circuit 1102, and a pixel portion 1104 having a plurality of pixels 1103 are formed over a substrate 1100. The gate-signal line driver circuit 1101 and the source-signal line driver circuit 1102 are connected to an FPC (Flexible Printed Circuit) 1105. The p-channel TFT 812 and the n-channel TFT 813 each shown in FIG. 8C can be used for the source-signal line driver circuit or the gate-signal line driver circuit.

The source-signal line driver circuit 1102 includes a shift register circuit, a level shifter circuit, and a sampling circuit. A clock signal (CLK) and a start pulse (SP) are inputted into the shift register circuit, which outputs a sampling signal for sampling a video signal. The sampling signal outputted from the shift register is inputted into the level shifter circuit, whereby the signal is amplified. The amplified sampling signal is then inputted into the sampling circuit. The sampling circuit samples a video signal inputted externally and inputs it into the pixel portion.

Such driver circuits require high-speed operation; therefore, a TFT having a GOLD structure is preferably used. This is because a Lov region has a function to alleviate a high electric field generated in vicinity of a drain, which can prevent hot carrier deterioration. In addition, since a sampling circuit requires a measure against hot carrier deterioration and low OFF current, a structure having a Lov region and a Loff region is preferable. On the other hand, a switching TFT for a pixel or a storage TFT for storing a gate voltage of a current controlling TFT is preferably formed of a TFT having a Loff region that is capable of decreasing OFF current.

In view through the above respects, in this embodiment mode, the n-channel TFTs in the driver circuit portion each have a Lov region, the sampling circuit TFT has a Loff region and a Lov region, and the switching TFT in the pixel portion has a Loff region. Therefore, a semiconductor device manufactured according to this embodiment mode is to be a display device capable of high-speed operation with less leak-current. In addition, the semiconductor device of this embodiment mode can be manufactured compactly; thus, a small display device that is easily carried out can be realized.

Needless to say, the present invention is not limited to a display device having the above structure and can be applied in manufacturing various display devices.

Embodiment Mode 5

In this embodiment mode, the TFTs having various structures explained in Embodiment Mode 1 to Embodiment Mode 3 are each formed from high temperature poly-silicon, and further a method for manufacturing a liquid crystal display panel is explained with reference to FIGS. 19A to 19D and FIGS. 20A to 20D. A liquid crystal display panel in this embodiment mode has a structure including a peripheral driver circuit and a pixel portion over one substrate. Note that this embodiment mode can be arbitrarily combined with Embodiment Mode 1 to Embodiment Mode 4 within the range of enablement.

Figure 19A:
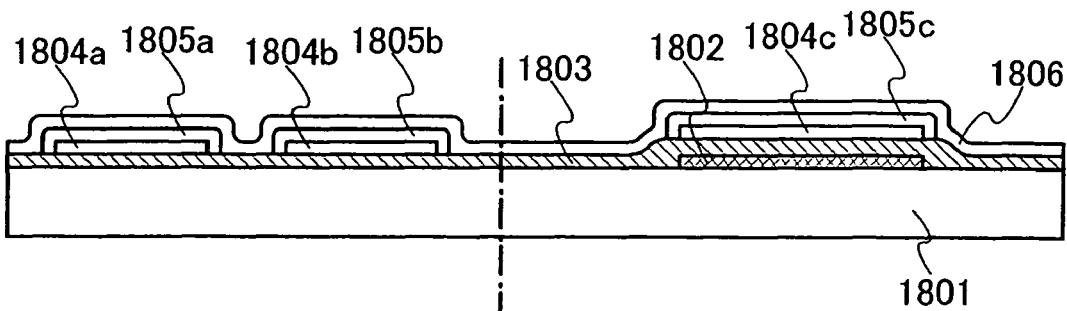
FIGS. 19A to 19D are views each showing Embodiment Mode 5 according to a certain aspect of the present invention.

A quartz substrate 1801 is prepared as shown in FIG. 19A. An anneal process may be performed to the quartz substrate at high temperatures of 900° C. to 1200° C. so that the substrate does not warp in the subsequent process.

Next, a light-shielding film 1802 is formed over the quartz substrate 1801. The light-shielding film is formed by etching a metal film after being deposited in a film thickness of 100 nm to 400 nm by sputtering. A tungsten (W) film or a tungsten silicide (WSi) film can be given as an example of the metal film.

A first interlayer insulating film 1803 is formed to cover the light-shielding film 1802. A silicon oxide film is formed with the use of a TEOS (tetraethyl orthosilicate) gas by an atmospheric-pressure CVD method or a low-pressure CVD method; thus, the interlayer insulating film 1803 is formed.

When the light-shielding film is a tungsten film and heat treatment is performed to the quartz substrate 1801 within a furnace at 1150° C. for 60 minutes after forming the first interlayer insulating film, a tungsten silicide film can be obtained from the light-shielding film.

Then, an amorphous semiconductor film is formed over the first interlayer insulating film 1803. In this embodiment mode, an amorphous silicon film is formed as the amorphous semiconductor film at temperatures of approximately 450° C. to 550° C. by a low-pressure CVD method. Thereafter, the amorphous silicon film is crystallized by an anneal process at temperatures of 600° C. to 700° C. for one hour to 10 hours in a nitrogen atmosphere. A polysilicon film that is obtained by crystallizing has a thickness of 50 nm to 200 nm. Then, island-shaped semiconductor films 1804a to 1804c including the polysilicon are formed through a photolithography step. Note that an impurity element may be doped into the semiconductor films to reduce the resistance.

Then, thermal oxidation silicon films 1805a to 1805c in 30 nm thick are formed by performing thermal oxidation at temperatures of 900° C. to 1200° C., preferably 1000° C. to 1150° C. to the island-shaped semiconductor films 1804a to 1804c. Further, a silicon nitride film 1806 in 50 nm thick is formed by a low-pressure CVD method or the like so as to cover the thermal oxidation silicon films. A gate insulating film is formed to include the thermal oxidation silicon films 1805a to 1805c and the silicon nitride film 1806.

Figure 19B:
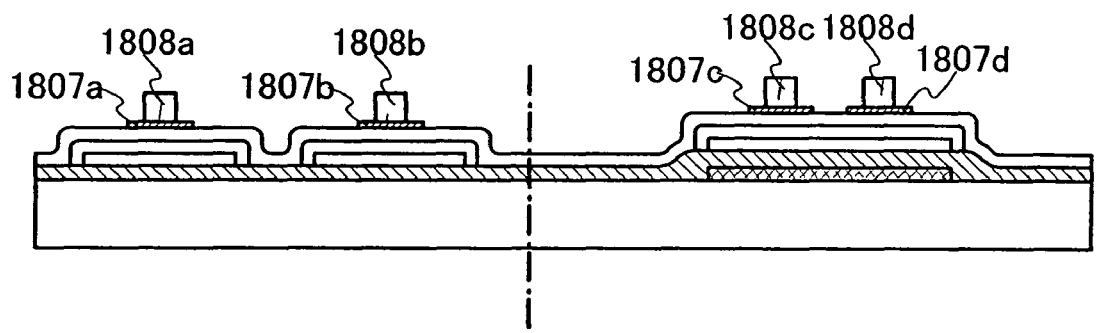

Thereafter, as shown in FIG. 19B, a hat-shaped gate electrode is formed over the silicon nitride film 1806 according to the methods shown in Embodiment Mode 1 and Embodiment Mode 4. The hat-shaped gate electrode is formed to include second gate electrodes 1807a to 1807d and third gate electrodes 1808a to 1808d.

Figure 19C:
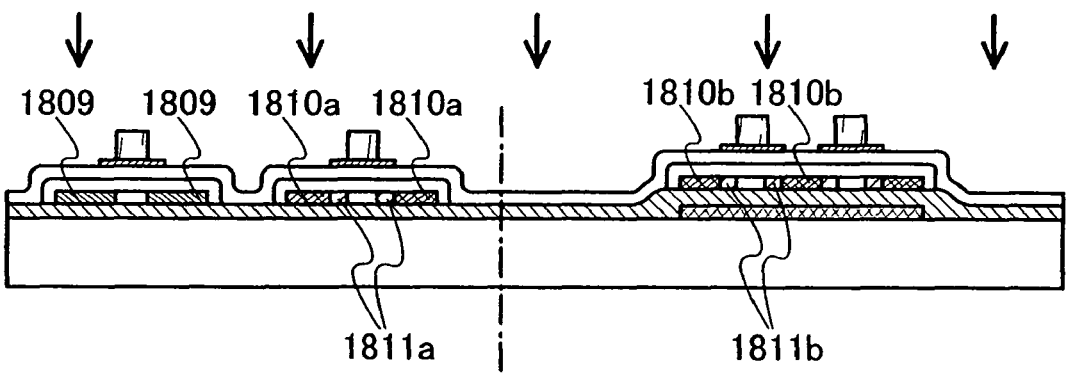
Figure 19D:
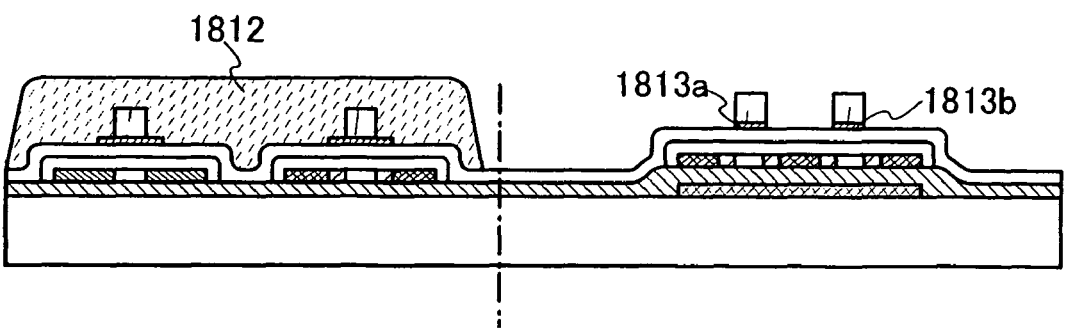

Then, as shown in FIG. 19C, a p-type high-concentration impurity region 1809, n-type high-concentration impurity regions 1810a and 1810b, and n-type low-concentration impurity regions 1811a and 1811b are formed by performing first to third doping in the same manner as Embodiment Mode 4.

Thereafter, a resist 1812 is formed so as to cover the peripheral driver circuit as shown in FIG; 19D. Then, the second gate electrodes 1807c and 1807d are etched by using the resist 1812 and the third gate electrodes 1808c and 1808d as masks to form second gate electrodes 1813a and 1813b of which gate length is the same as that of the third gate electrodes.

Figure 20A:
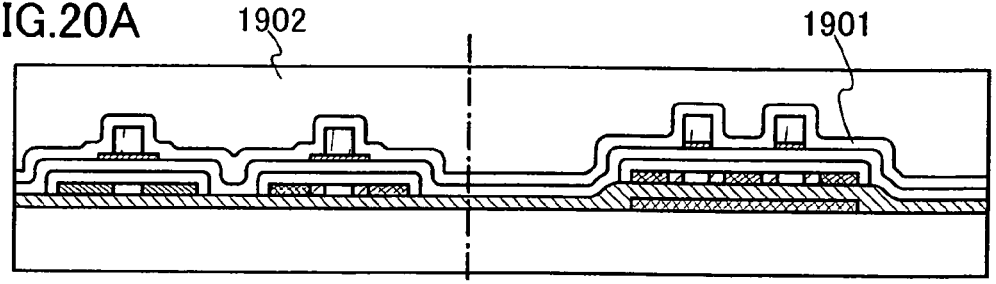
FIGS. 20A to 20D are views each showing Embodiment Mode 5 according to a certain aspect of the present invention.

Then, as shown in FIG. 20A, a passivation film 1901 and a second interlayer insulating film 1902 are formed over the third gate electrodes in the same manner as Embodiment Mode 4.

Figure 20B:
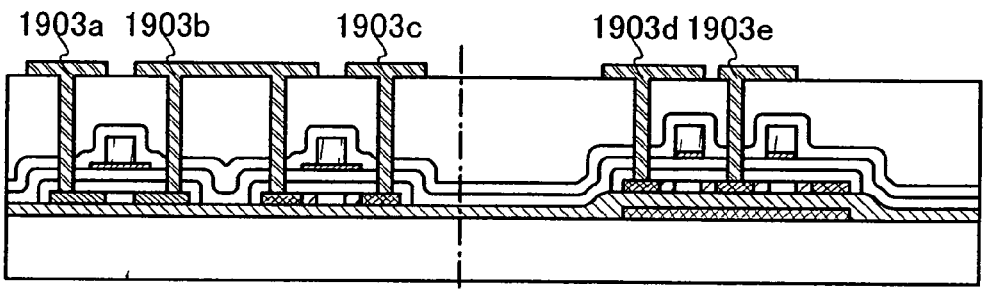

Next, contact holes are formed in the thermal oxidation silicon films 1805a to 1805c, the silicon nitride film 1806, the passivation film 1901, and the second interlayer insulating film 1902 to form source and drain wirings 1903a to 1903e (FIG. 20B). At this time, incident light on the island-shaped semiconductor film 1804c can be light-shielded by forming the source or drain wiring 1903d from a light-shielding material to be overlapped with the third gate electrode 1808c thereover.

Figure 20C:
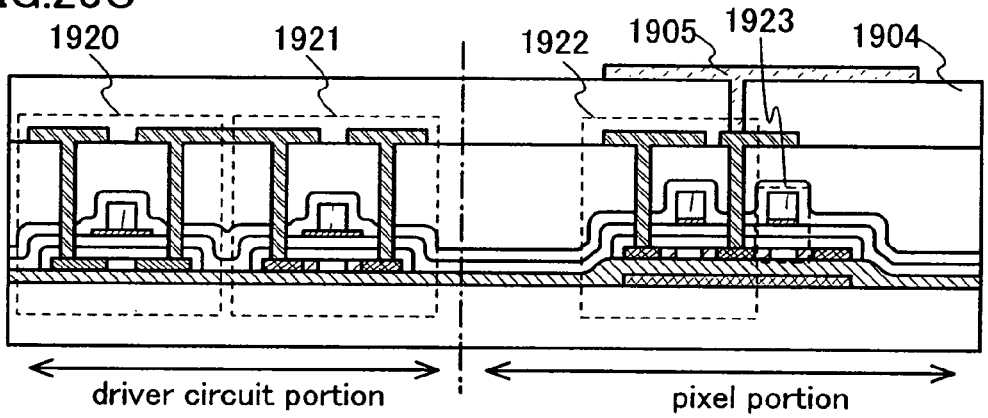
Figure 20D:
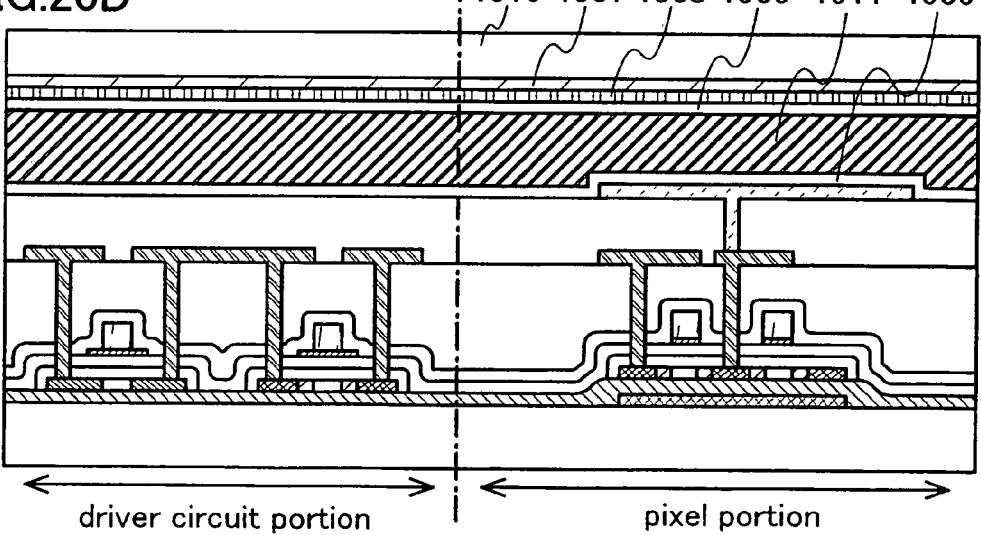

Then, a third interlayer insulating film 1904 is formed over the source and drain wirings 1903a to 1903e as shown in FIG. 20C. Thereafter, a contact hole is formed in the third interlayer insulating film so as to expose the source or drain wiring 1903e to form a pixel electrode 1905.

As mentioned above, a p-channel TFT 1920 and an n-channel TFT 1921 each included in the peripheral driver circuit are formed over the quartz substrate 1801. An n-channel pixel TFT 1922 and a storage capacitor 1923 are each formed in the pixel portion.

Thereafter, an alignment film 1906 is formed over the pixel electrode 1905. Then, a substrate 1910 in which a color filter 1907, an opposite electrode 1908, and an alignment film 1909 are formed is prepared, and the quartz substrate 1801 and the substrate 1910 are attached by a sealant (not shown). Thereafter, a liquid crystal display panel provided with the peripheral driver circuit is completed by injecting a liquid crystal 1911.

In the liquid crystal display panel of this embodiment mode, the peripheral driver circuit can be provided with the n-channel TFT 1921 of a GOLD structure having a Lov region and the pixel portion can be provided with the n-channel pixel TFT 1922 having a Loff region. Accordingly, a liquid crystal display panel having a peripheral driver circuit with less deterioration of ON current and high operating speed and a pixel portion with less leak current can be manufactured. In addition, a liquid crystal display panel formed of submicron TFTs can be provided; thus, an extremely compact and lightweight display device can be realized.

Although an LDD region is not formed in the p-channel TFT of this embodiment mode, an LDD region may be formed also in the p-channel TFT in the same manner as the method for forming an LDD region in the n-channel TFTs. Further, a TFT having both a Lov region and a Loff region as shown in Embodiment Mode 3 may be formed in the peripheral driver circuit. In this case, the TFT can be formed through the same method as that in Embodiment Mode 4. In addition, although the Loff region of the n-channel pixel TFT 1922 is formed through the method shown in Embodiment Mode 1, the Loff region may be formed through the method shown in Embodiment Mode 2.

Moreover, this embodiment mode shows an example of a liquid crystal display panel where a peripheral driver circuit is integrated; however, a CPU can be formed simultaneously along with the peripheral driver circuit. In this case, a much integrated liquid crystal display panel can be formed; thus, a compact display device can be provided.

Embodiment Mode 6

Figure 21A:
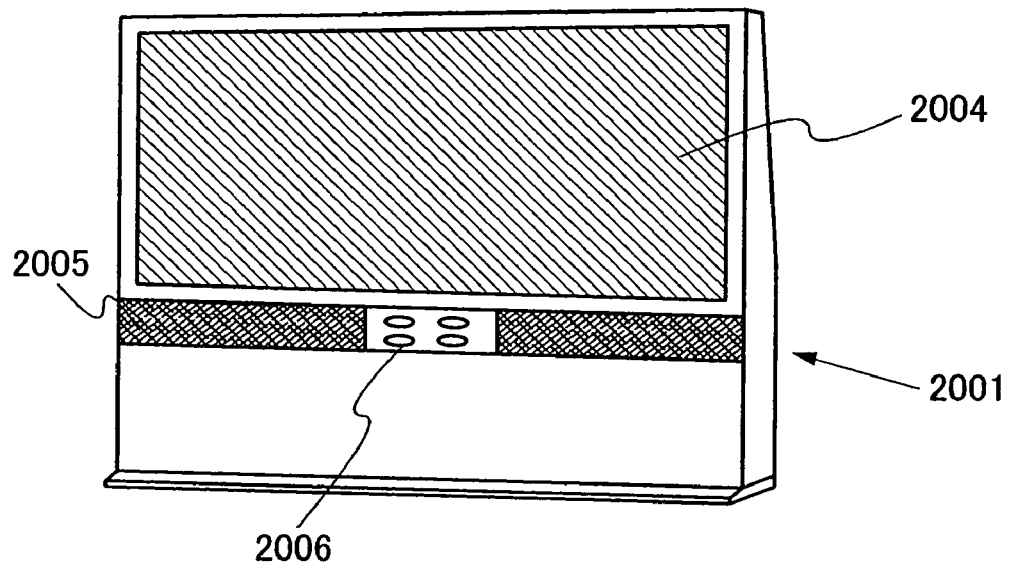
FIGS. 21A and 21B are views each showing Embodiment Mode 6 according to a certain aspect of the present invention.
Figure 21B:
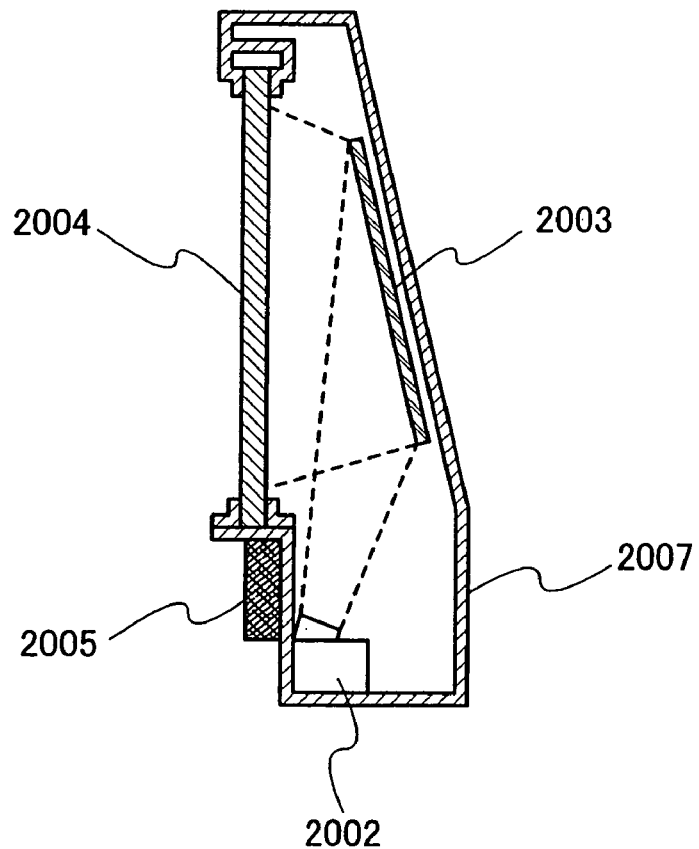

This embodiment mode shows an example of a liquid crystal display device using the liquid crystal display panel in Embodiment Mode 5. FIG. 21A is an external view of a liquid crystal display device viewed from the front face, and FIG. 21B is a cross-sectional view of a liquid crystal display device viewed from the side surface, which shows the internal structure. A back-projection display device 2001 shown in FIGS. 21A and 21B includes a projector unit 2002, a mirror 2003, and a screen 2004. In some cases, a speaker 2005 and operating switches 2006 are provided as well. This projector unit 2002 is provided at the bottom part of a housing 2007 of the back-projection display device 2001 and projects on the mirror 2003 light that projects an image according to an image signal. The back-projection display device 2001 has a structure of displaying an image projected from the back of the screen 2004.

Figure 22:
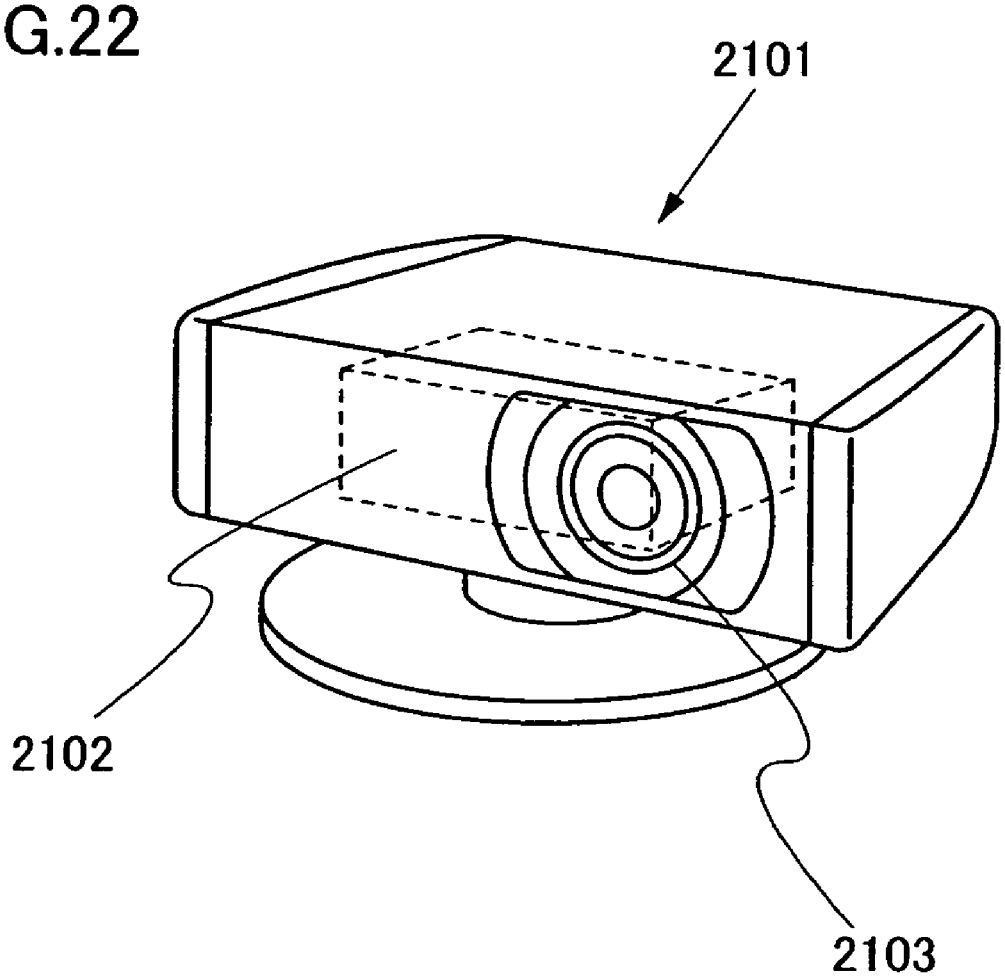
FIG. 22 is a view showing Embodiment Mode 6 according to a certain aspect of the present invention.

On the other hand, FIG. 22 shows a front-projection display device 2101. The front-projection display device 2101 includes a projector unit 2102 and a projection optical system 2103. This projection optical system 2103 has a structure of projecting an image on a screen and the like provided in the front.

Hereinafter, a structure of a projector unit applied to the back-projection display device 2001 shown in FIGS. 21A and 21B and the front-projection display device 2101 shown in FIG. 22 is explained.

Figure 23:
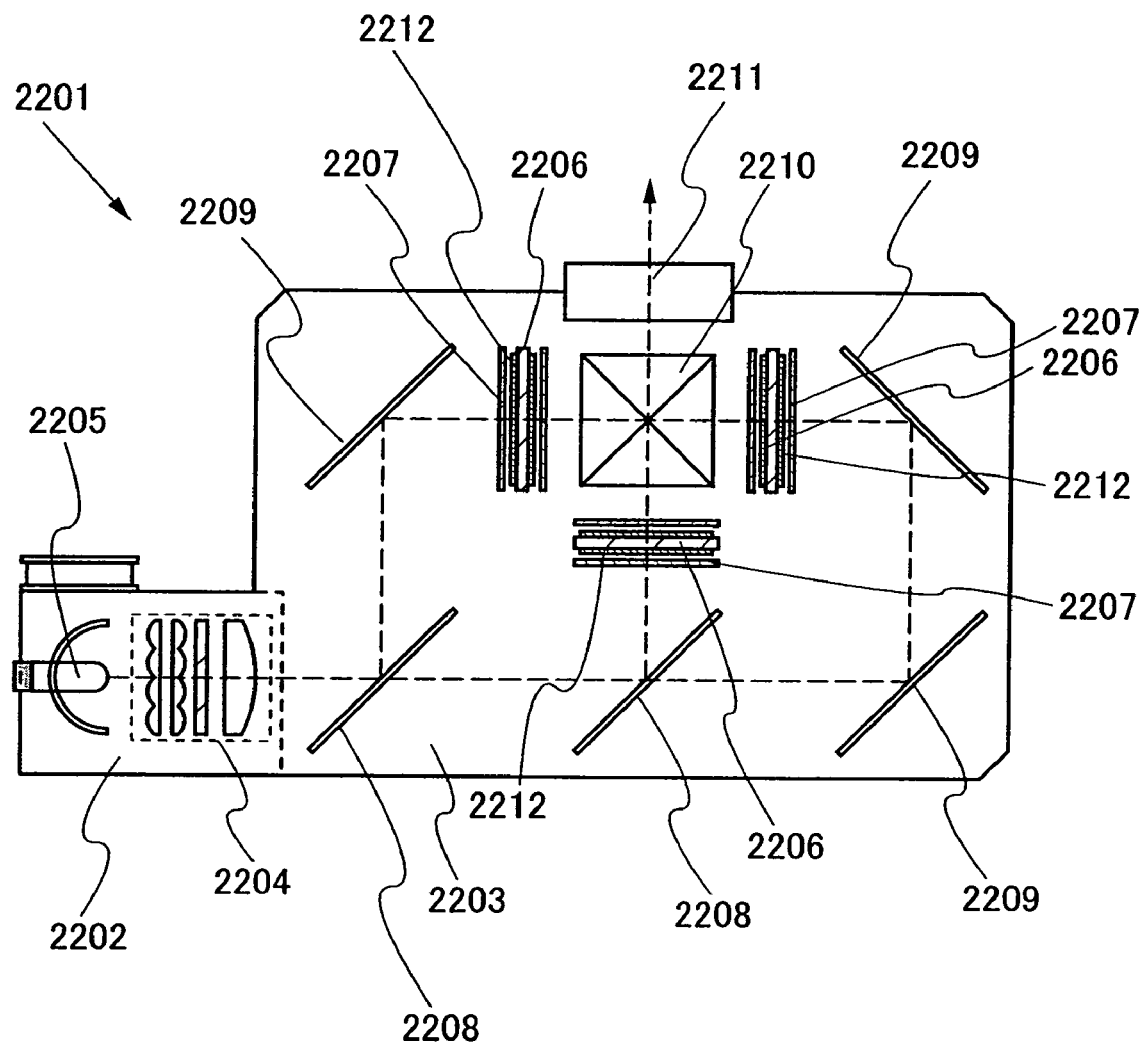
FIG. 23 is a view showing Embodiment Mode 6 according to a certain aspect of the present invention.

FIG. 23 shows one structural example of a projector unit 2201. This projector unit 2201 includes a light source unit 2202 and a modulator unit 2203. The light source unit 2202 includes a light source optical system 2204 having lenses and a light source lamp 2205. The light source lamp 2205 is placed in a housing so that stray light does not diffuse. A lamp capable of radiating a large amount of light, for example, a high-pressure mercury lamp, a xenon lamp, or the like is used as the light source lamp 2205. The light source optical system 2204 is appropriately provided with an optical lens, a film having a polarization function, a film for adjusting phase difference, an IR film, or the like in its structure. In addition, the light source unit 2202 is provided so that radiated light enters the modulator unit 2203. The modulator unit 2203 includes a plurality of liquid crystal panels 2206 shown in Embodiment Mode 5, a retardation film 2207, a dichroic mirror 2208, a mirror 2209, a prism 2210, and projection optical system 2211. The light radiated from the light source unit 2202 is separated into a plurality of light paths through the dichroic mirror 2208.

Each light path is provided with a color filter 2212 transmitting light of a predetermined wavelength or wavelength range and the liquid crystal panel 2206. The liquid crystal panel 2206, which is a transmitting type, modulates transmitted light according to an image signal. Light of each color that transmitted through the liquid crystal panel 2206 enters the prism 2210 and displays an image on a screen through the projection optical system 2211. A fresnel lens is provided between the mirror 2003 in FIG. 21B and the screen 2004. Then, projection light that is projected by the projector unit 2201 and reflected on the mirror 2003 in FIG. 21B is converted to approximate parallel light by this fresnel lens and projected on the screen.

Figure 24:
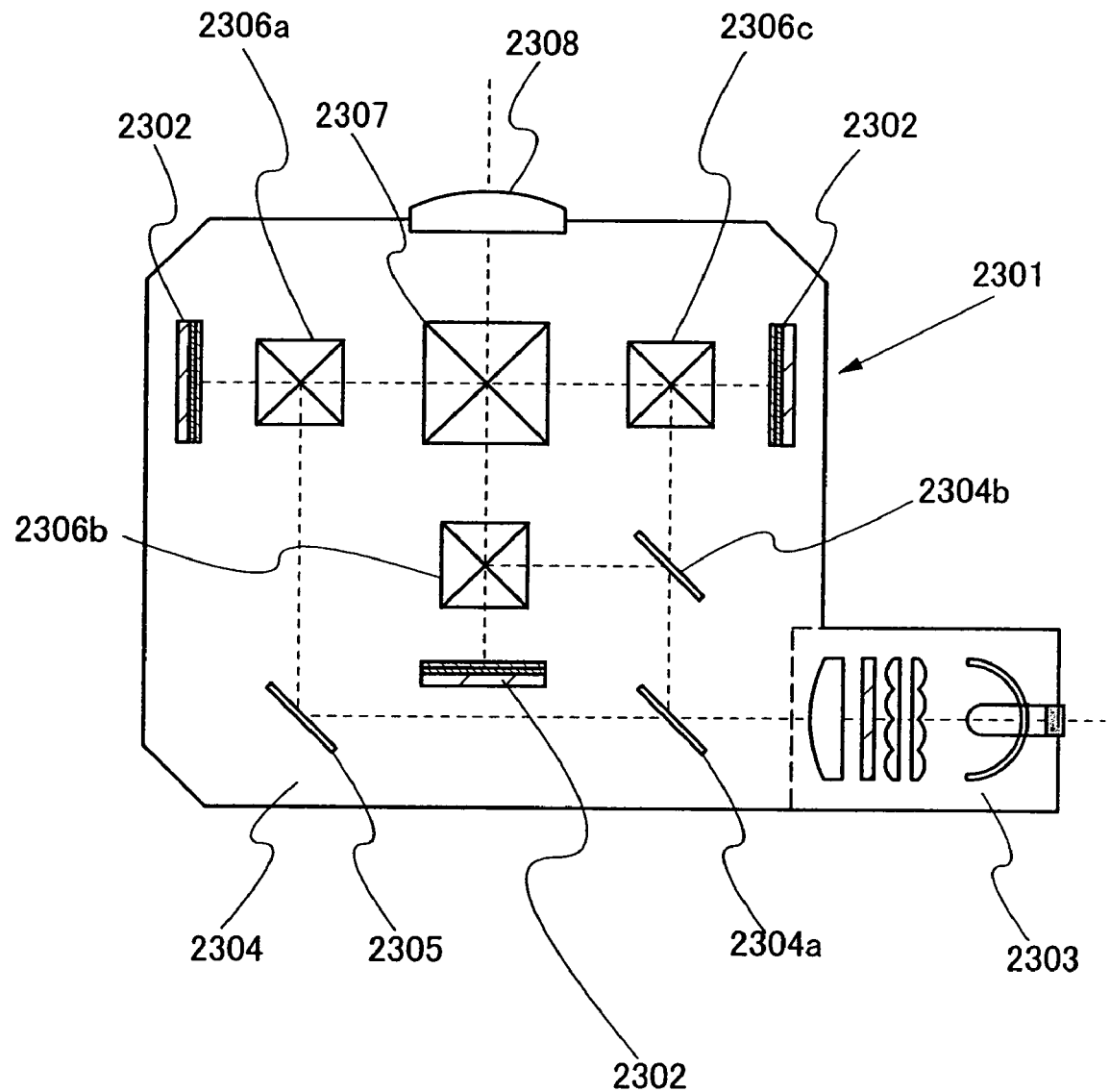
FIG. 24 is a view showing Embodiment Mode 6 according to a certain aspect of the present invention.

A projector unit 2301 shown in FIG. 24 has a structure provided with the reflective liquid crystal panel shown in Embodiment Mode 5. In the liquid crystal panel of Embodiment Mode 5, a reflective liquid crystal panel 2302 has a structure in which a pixel electrode is formed from aluminum (Al), Ti (titanium), or an alloy thereof.

This projector unit 2301 includes a light source unit 2303 and a modulator unit 2304. The light source unit 2303 has the same structure as that in FIG. 22. Light from the light source unit 2303 is separated into a plurality of light paths through dichroic mirrors 2304a and 2304b, and a total reflection mirror 2305 to enter a polarization beam splitter. Polarization beam splitters 2306a to 2306c are each provided corresponding to the reflective liquid crystal panels 2302 corresponding to each color. The reflective liquid crystal panel 2302 modulates transmitted light according to an image signal. Light of each color reflected through the reflective liquid crystal panel 2302 is entered into a prism 2307 and is projected through a projection optical system 2308.

In the light radiated from the light source unit 2303, only light with a red wavelength region is transmitted at the dichroic mirror 2304a, and the light with green and blue wavelength regions is reflected. Further, only light with a green wavelength region is reflected at the dichroic mirror 2304b. The light with a red wavelength region that is transmitted through the dichroic mirror 2304a is reflected on the total reflection mirror 2305 to enter the polarization beam splitter 2306a. In addition, the light with a green wavelength region enters the polarization beam splitter 2306b, and the light with a blue wavelength region enters the polarization beam splitter 2306c. The polarization beam splitters each have a function to separate the incident light into P polarization and S polarization and a function to transmit only P polarization. The reflective liquid crystal panel 2302 polarizes the incident light according to an image signal.

Only S polarization corresponding to each color enters the reflective liquid crystal panel 2302 corresponding to each color. The reflective liquid crystal panel 2302 operates in an electrical controlled birefringence mode (ECB). In addition, liquid crystal molecules are oriented vertically by having a certain angle with respect to a substrate. Thus, when the pixel of each reflective liquid crystal panel 2302 is in an OFF state, the liquid crystal molecules are oriented so that incident light is reflected without changing the polarization thereof. Moreover, when the pixel is in an ON state, the orientation state of the liquid crystal molecules is changed and the polarization of incident light is changed.

The projector unit 2301 shown in FIG. 24 can be applied to the back-projection display device 2001 shown in FIGS. 21A and 21B and the front-projection display device 2101 shown in FIG. 22.

Figure 25A:
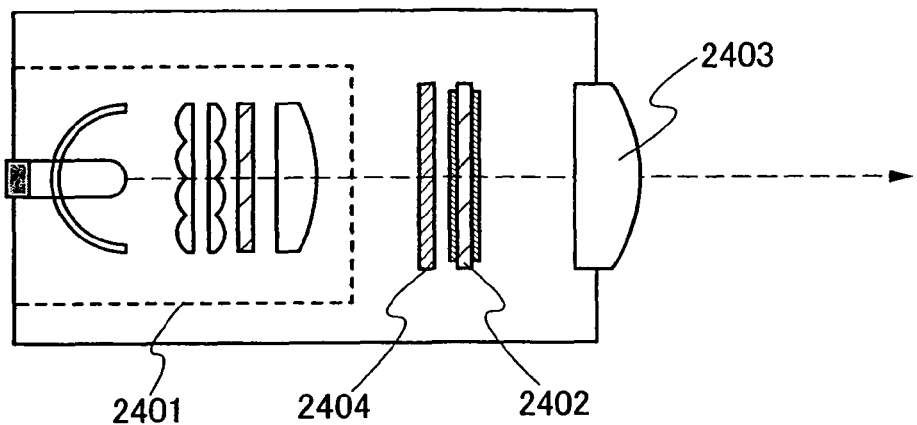
FIGS. 25A to 25C are views each showing Embodiment Mode 6 according to a certain aspect of the present invention.
Figure 25B:
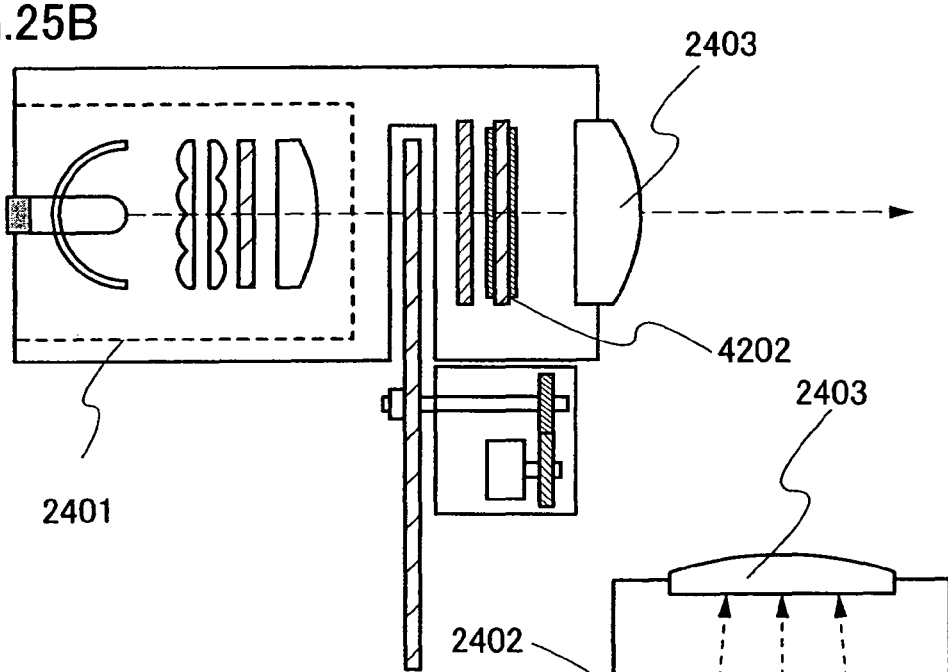
Figure 25C:
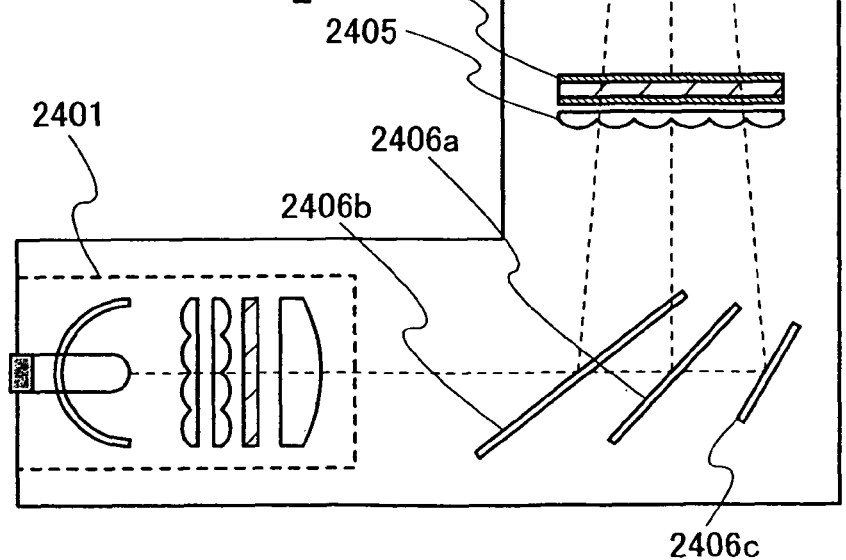

Projector units shown in FIGS. 25A to 25C each show a single-board structure. A projector unit shown in FIG. 25A includes a light source unit 2401, a liquid crystal panel 2402, a projection optical system 2403, and retardation film 2404. The projection optical system 2403 includes one or a plurality of lenses. The liquid crystal panel 2402 is provided with a color filter.

FIG. 25B shows a structure of a projector unit operated with a field sequential system. Through a field sequential system, light of each color such as red, green, or blue sequentially incident on a liquid crystal display panel to be delayed temporally obtains color display without a color filter. In particular, a high-precision image can be displayed by being combined with a rapid-response liquid crystal panel. In FIG. 25B, a rotating color filter board provided with a plurality of color filters of red, green, or blue one is provided between a light source unit 2401 and a liquid crystal panel 2402.

A projector unit shown in FIG. 25C has a color-separation structure using a macrolens as a color display system. In this system, a microlens array 2405 is provided on a light incident side of a liquid crystal panel 2402 and light of each color is lighted from respective directions; thus, color display is realized. Since a projector unit that employs this system looses little light due to a color filter, light radiated from a light source unit 2401 can be utilized effectively. The projector unit is provided with a B dichroic mirror 2406*a*, a G dichroic mirror 2406*b*, and an R dichroic mirror 2406*c* so that the liquid crystal panel 2402 is lighted with light of each color from respective directions.

As mentioned above, various structures of liquid crystal display devices having the liquid crystal display panel in Embodiment Mode 5 as a liquid crystal panel is shown. Since a liquid crystal display device of the present invention can have an extremely compact liquid crystal panel built-in, a small and lightweight liquid crystal display device can be realized as an entire device. In addition, the liquid crystal display device has a liquid crystal panel with a structure appropriate for various circuits; therefore, a liquid crystal display device having high reliability with less display deterioration can be realized.

Embodiment Mode 7

This embodiment mode explains a method for manufacturing an ID chip provided with a TFT having a Lov region or a Loff region with reference to FIGS. 10A to 10D, FIGS. 11A to 11D, FIGS. 12A and 12B, and FIGS. 13A and 13B. Note that the ID chip herein refers to a semiconductor device having an antenna in addition to a semiconductor integrated circuit or a thin film integrated circuit, which reads out data by wireless and the like. The ID chip has a function to store data to be read out, which is a so-called electronic tag. This embodiment mode can be arbitrarily combined with Embodiment Mode 1 to Embodiment Mode 4 within the range of enablement.

First, a peeling layer 92 is formed over a glass substrate 91. A layer containing silicon as its main component such as amorphous silicon or polycrystalline silicon, can be used as the peeling layer. Subsequently, a base film 93 is formed. Silicon oxide ($SiO_x$), silicon nitride ($SiN_x$), or silicon oxynitride ($SiO_xN_y$) can be used as the base film 93. Island-shaped semiconductor films 94*a* to 94*c* are formed over the base film 93. The island-shaped semiconductor films 94*a* to 94*c* are formed by etching a semiconductor film after being deposited by a CVD method or a sputtering method. Thereafter, the island-shaped semiconductor films are irradiated with laser light to be crystallized. Subsequently, a gate insulating film 95 is formed so as to cover the island-shaped semiconductor films 94*a* to 94*c*. Then, a first conductive film 96 to be a first gate electrode and a second conductive film 97 to be a second gate electrode are formed. The first conductive film and the second conductive film can be formed by using the material mentioned in Embodiment Mode 1 and the combination thereof is determined so that each of them can be etched at a certain selection ratio. TaN/W is used as the first conductive film/the second conductive film. Then, resists 98*a* to 98*d* are formed over the island-shaped semiconductor films 94*a* to 94*c*, and over the second conductive film 97 as well (see FIG. 10A).

Figure 10A:
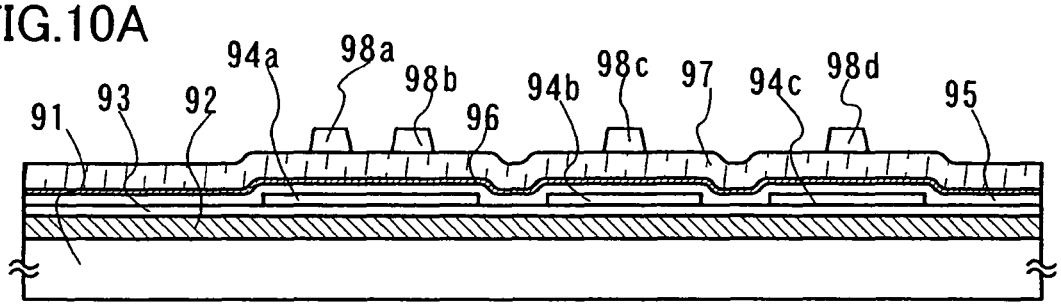
FIGS. 10A to 10D are views each showing Embodiment Mode 7 according to a certain aspect of the present invention.
Figure 10B:
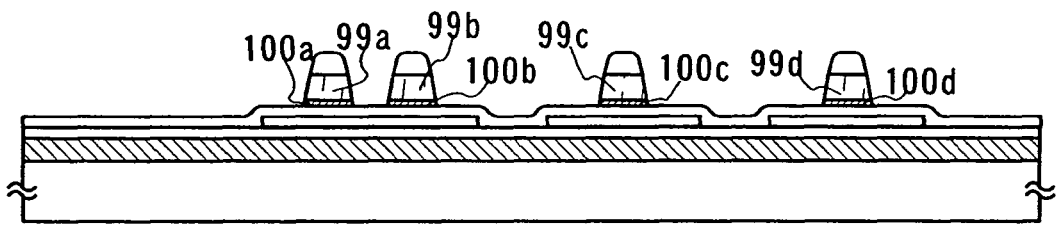

Subsequently, first and second etching are performed (FIG. 10B). Through the first etching, the second conductive film 97 is etched by using the resists 98*a* to 98*d* as masks to form first gate electrodes 99*a* to 99*d*. At this time, the resists 98*a* to 98*d* are also etched. Then, through the second etching, the first conductive film 96 is etched by using the first gate electrodes 99*a* to 99*d* as masks to form second gate electrodes 100*a* to 100*d*. The resists 98*a* to 98*d* are etched to some extent through the second etching, too.

Figure 10C:
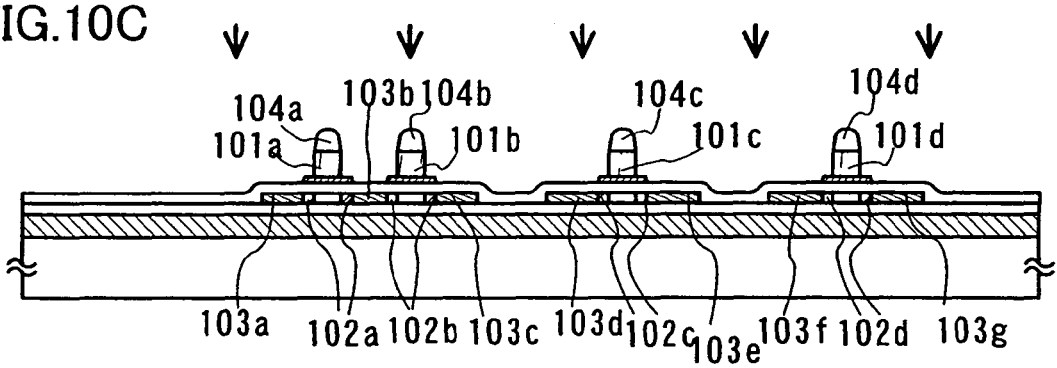

Then, a third etching is performed (FIG. 10C). Through the third etching, the first gate electrodes 99*a* to 99*d* are etched. At this time, the resists 98*a* to 98*d* are recessed by being etched simultaneously. While the recessed resists 98*a* to 98*d* are used as masks, the first gate electrodes 99*a* to 99*d* are also recessed by being etched. Consequently, third gate electrodes 101*a* to 101*d* each having a shorter gate length than that of the second gate electrodes 100*a* to 100*d* are formed. The recessed resists 98*a* to 98*d* are to be resists 104*a* to 104*d*.

Then, a first doping is performed (FIG. 10C). An n-type impurity element (phosphorous in this embodiment mode) is added to form impurity regions 102*a* to 102*d* and 103*a* to 103*g* containing phosphorous. At this time, the impurity element concentration of the impurity regions 102*a* to 102*d* and 103*a* to 103*g* is $1\times10^{16}$ atoms/cm$^3$ to $1\times10^{20}$ atoms/cm$^3$ (preferably, $1\times10^{16}$ atoms/cm$^3$ to $5\times10^{18}$ atoms/cm$^3$). Since the doping to the impurity regions 102*a* to 102*d* is performed through the second gate electrodes, the doping is performed in lower concentration than the impurity element concentration in the impurity regions 103*a* to 103*g*. Thereafter, the resists 104*a* to 104*d* are removed. The resists 104*a* to 104*d* may be removed after the second doping in the subsequent step or after the third etching in the previous step, as well.

Figure 10D:
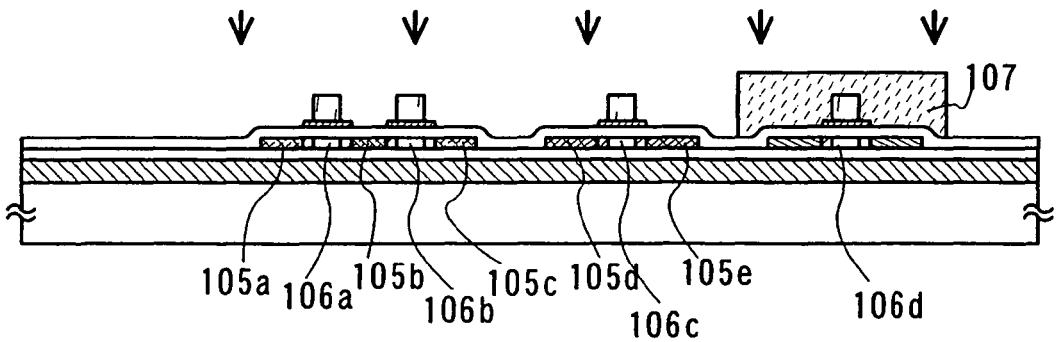

Subsequently, a second doping is performed to the island-shaped semiconductor films 94*a* and 94*b* (FIG. 10D). A resist 107 is formed over the third gate electrode 101*d* so that the second doping is not performed to the island-shaped semiconductor film 94*c*. Through the second doping, an impurity element is doped only to the impurity regions 103*a* to 103*e*. Here, the doping is performed with an ion doping method using phosphine ($PH_3$), and the concentration of phosphorous in this region is controlled to be $1\times10^{20}$ to $1\times10^{21}$ atoms/cm$^3$ (typically, $2\times10^{20}$ to $5\times10^{21}$ atoms/cm$^3$). High-concentration impurity regions 105*a* to 105*e* to be a source region and a drain region are formed by this doping. Note that a certain degree of the impurity element is already doped in the impurity regions 105*a* to 105*e* through the first doping; however, the impurity regions 105*a* to 105*e* function as a source region and a drain region because a dose amount of the impurity element at the second doping is larger than a dose amount at the first doping.

Through the above processes, regions of the semiconductor film where the first doping and the second doping are not performed, that is, the semiconductor films below the resists 104*a* to 104*d* that are formed through the third etching are to be channel-forming regions 106*a* to 106*d*. In addition, the impurity regions 102*a* to 102*d* each are to be an LDD region.

Figure 11A:
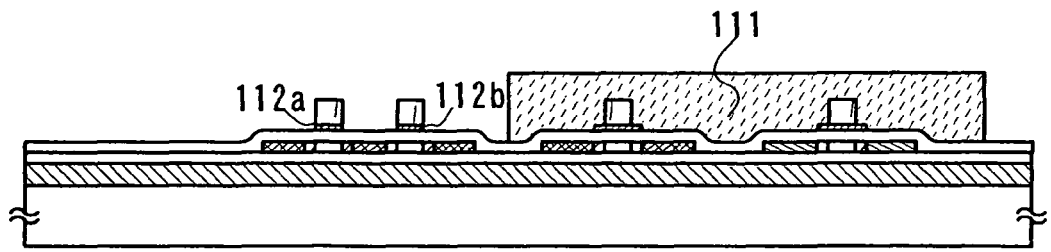
FIGS. 11A to 11D are views each showing Embodiment Mode 7 according to a certain aspect of the present invention.

Subsequently, a resist 111 is formed as shown in FIG. 11A. Then, a fourth etching is performed to the second gate electrodes 100*a* and 100*b* by using the third gate electrodes 101*a* and 101*b* as masks. Then, second gate electrodes 112*a* and 112*b* are formed by having the same gate length as the second gate electrodes 100*a* to 100*d* and the third gate electrodes 101*a* to 101*d*. Accordingly, the impurity regions 102*a* and 102*b* each of which is an LDD region are to be a Loff region.

The first to fourth etching of this embodiment mode can be performed by a dry etching method, and specifically, an ICP (Inductively Coupled Plasma) etching method can be used.

Subsequently, the resist 111 is removed, and a silicon oxide film is formed by a CVD method so as to cover the third gate electrodes and the second gate electrodes in each TFT. Then, the silicon oxide film is etched back by etching to form sidewalls 114a to 114d on opposite sides of the third gate electrodes 101a to 101d and the second gate electrodes 112a, 112b, 100c, and 100d. When the difference between the gate length of the third gate electrodes 101c and 101d and that of the second gate electrodes 100c and 100d is extremely small as 0.05 µm to 0.2 µm, the sidewalls are formed so as to cover the side surface of the second gate electrodes as well as that of the first gate electrodes.

Figure 11B:
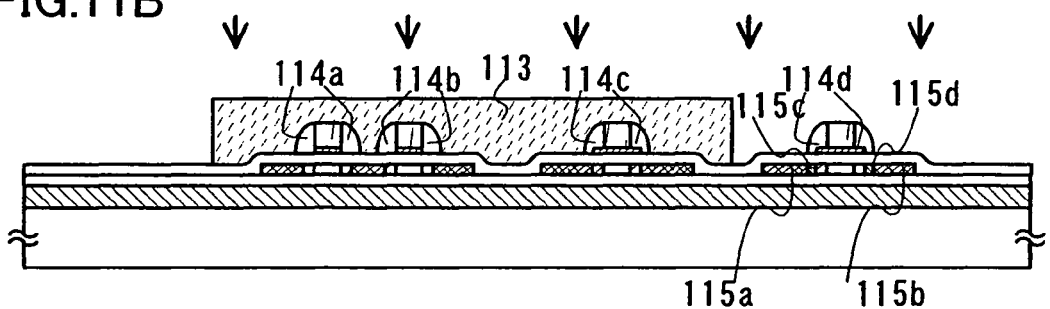

Then, a resist 113 is formed to perform a third doping using the resist 113, the third gate electrode 101d, and the sidewalls 114d as masks. Through this doping, high-concentration impurity regions 115a and 115b and low-concentration impurity regions 115c and 115d to be a Loff region are formed (FIG. 11B). The impurity regions 115a and 115b each function as a source region and a drain region. The impurity region 102d is to be a Lov region.

Figure 11C:
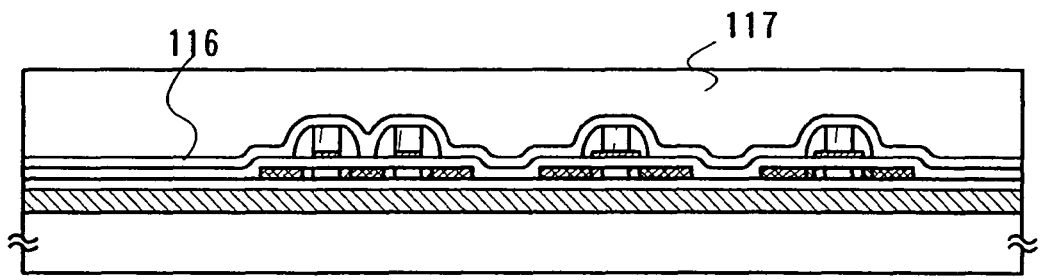
Figure 11D:
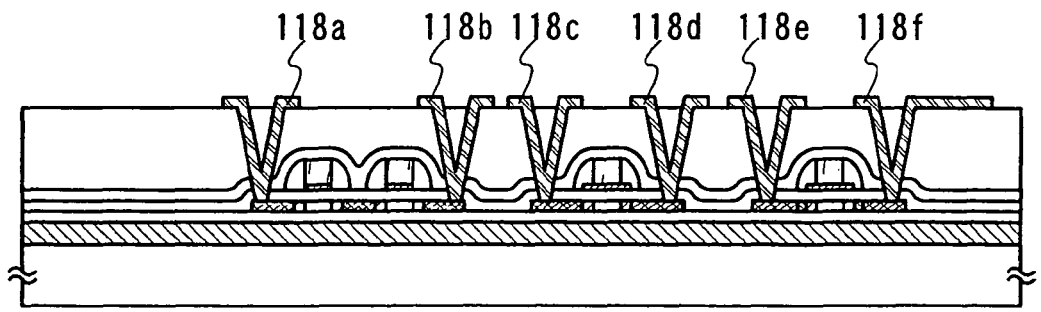

Subsequently, as shown in FIG. 11C, a passivation film 116 is formed and further a first interlayer insulating film 117 is formed. The passivation film 116 can be formed by using a silicon nitride film, a silicon oxynitride film, or the like. The first interlayer insulating film 117 can be formed by using an organic resin film, an inorganic insulating film, or an organic resin film such as siloxane.

Subsequently, contact holes are formed in the first interlayer insulating film 117, the passivation film 116, and the gate insulating film 95 to form source and drain electrodes 118a to 118f in contact with the impurity regions 105a, 105c to 105e, and 115a to 115b to be source and drain regions (FIG. 111D).

Then, a second interlayer insulating film 121 is formed over the first interlayer insulating film 117 and the source and drain electrodes 118a to 118f. The second interlayer insulating film 121 is partially formed with an opening so that part of the source and drain electrodes is exposed. Then, antennas 122a to 122e are formed over the second interlayer insulating film. The antenna 122e is formed to be partially in contact with the source and drain electrodes in the opening. Thereafter, a protective layer 123 is formed over the antennas 122a to 122e and the second interlayer insulating film 121 (see FIG. 12A).

Figure 12A:
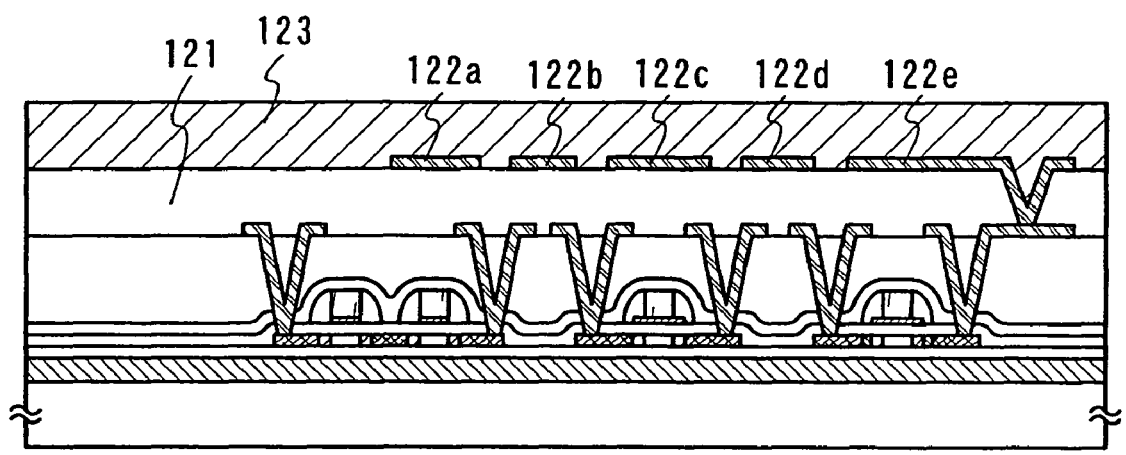
FIGS. 12A and 12B are views each showing Embodiment Mode 7 according to a certain aspect of the present invention.
Figure 12B:
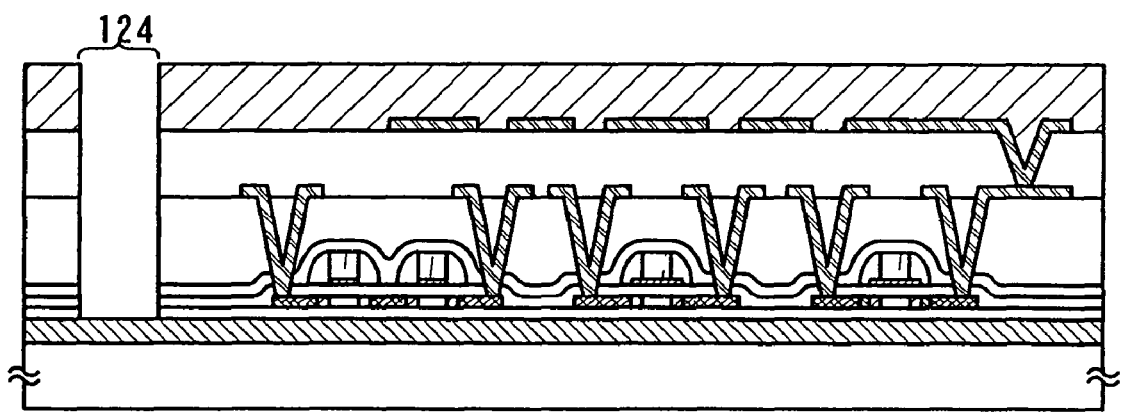

Subsequently, a groove 124 is formed to isolate adjacent ID chips as shown in FIG. 12B. The groove 124 is sufficient to be deep enough to expose the peeling layer 92. The groove 124 can be formed by dicing, scribing, or the like. Note that, when there is no need to isolate the ID chips formed over the glass substrate 91, the groove 124 is not necessarily provided.

Figure 13A:
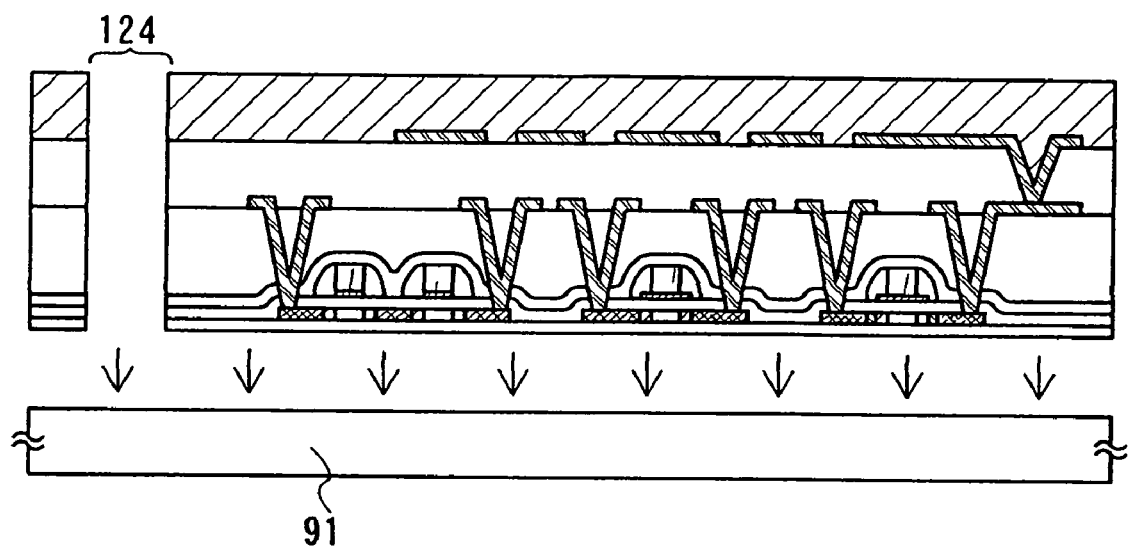
FIGS. 13A and 13B are views each showing Embodiment Mode 7 according to a certain aspect of the present invention.

Then, the peeling layer 92 is removed by etching as shown in FIG. 13A. In this manner, the glass substrate 91 is peeled off. In this embodiment mode, a halogen fluoride gas is used as an etching gas, which is injected through the groove 124. In this embodiment mode, other gas such as $ClF_3$ or a mixed gas of $ClF_3$ with nitrogen may be used, for example.

Figure 13B:
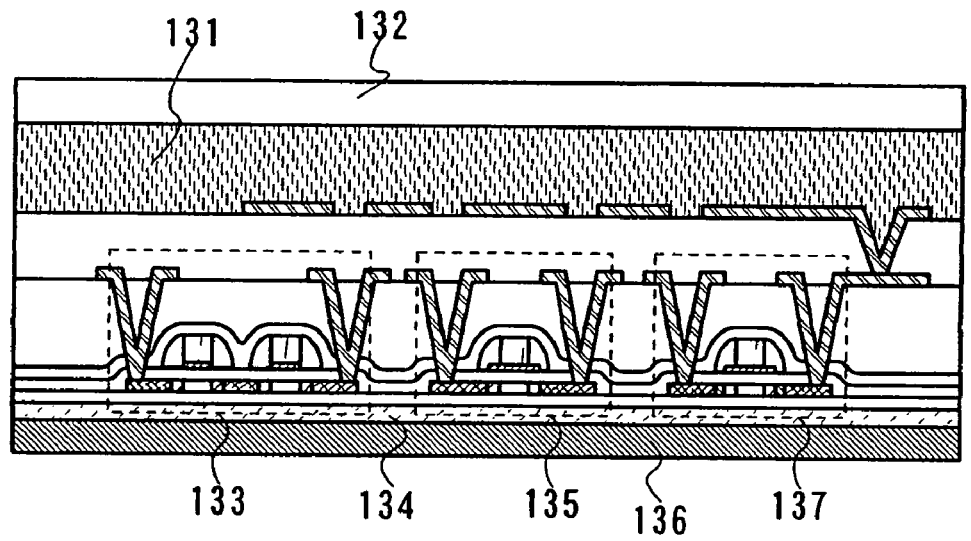

Then, TFTs 133, 135, and 137 and the antennas 122a to 122e are attached to a support base 136 by using an adhesive 134 as shown in FIG. 13B. The adhesive 134 is formed of a material that is capable of attaching the support base 136 and the base film 93 to each other. The adhesive 134 can be a curable adhesive of various types such as a reactive curable adhesive, a heat curable adhesive, an optical curable adhesive such as an ultraviolet light curable adhesive, or an anaerobic adhesive, for example. The support base 136 can be formed of flexible paper or an organic material such as plastic.

In addition, after removing the protective layer 123, an adhesive 131 is coated over the second interlayer insulating film 121 so as to cover the antennas 122a to 122e; therefore, a cover member 132 is attached thereto. As well as the support base 136, the cover member 132 can be formed of flexible paper an organic material such as or plastic. The adhesive 131 is formed of a material capable of attaching the cover member 132 and the second interlayer insulating film 121 to each other. The adhesive 131 can be a curable adhesive of various types such as a reactive curable adhesive, a heat curable adhesive, an optical curable adhesive such as an ultraviolet light curable adhesive, or an anaerobic adhesive, for example.

Through the above processes, an ID chip is completed. Note that this embodiment mode is not limited to this manufacturing method. This embodiment mode is merely an example in which an ID chip can be completed by arbitrarily combining TFTs whose structures each have a Lov region, a Loff region, or both a Lov region and a Loff region to be manufactured simultaneously over one substrate. Thus, an ID chip including a TFT having only a Lov region or a Loff region, or an ID chip including only a TFT having both Lov and Loff regions may be manufactured as well.

In other words, according to the present invention, an ID chip provided with TFTs having various structures over one substrate can be manufactured and different ID chips can be manufactured for different purposes in a process having a few processing step. Thus, the manufacturing cost can be reduced and the yield can be improved.

Moreover, although TFTs used in an ID chip require fine processing, a TFT manufactured according to the present invention can be also applied to a submicron TFT. Therefore, it is most appropriate to manufacture an ID chip according to the present invention.

TFTs used in an ID chip require fine processing; therefore, they are preferably formed by a photolithography step using stepper. However, in using a stepper, an LDD region is formed by using a resist mask, which involves a larger number of masks necessary for the whole steps. Thus, it leads to a higher manufacturing cost. In addition, in using a fine pattern, a margin of the fine processing becomes small. For example, in the case of forming a Lov region of 0.5 µm on one side of a gate electrode of 2 µm by using a mask, an alignment accuracy of 0.1 µm or less is required. When isotropic etching is performed to the gate electrode, optimization of the etching time is difficult to achieve. Specifically, it is impossible to inspect the amount etched in the lateral direction from the edge of the mask. In other words, the end point of the etching cannot be inspected, which is thus difficult to evaluate the etching rate in the lateral direction. Unstable etching rate in the lateral direction hinders the establishment of a stable process.

Thus, the present invention is suitable to manufacture a semiconductor device including TFTs that require fine processing, particularly such as an ID chip, a CPU, a flash memory, or a display device integrated with an audio signal processing circuit. In manufacturing such semiconductor devices, TFTs having the desired structure can be obtained while achieving the reduction in manufacturing cost and improvement of the yield.

Figure 26A:
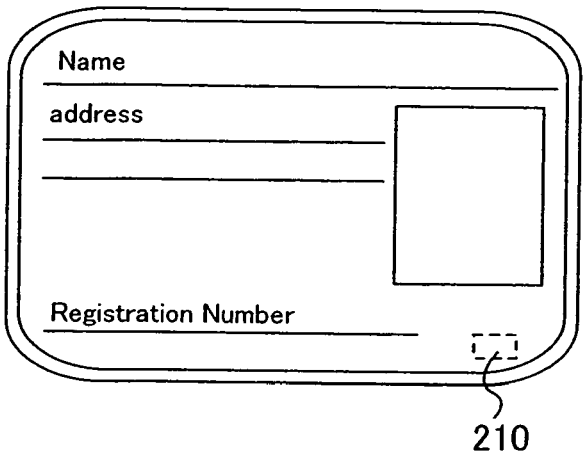
FIGS. 26A to 26E are views each showing Embodiment Mode 7 according to a certain aspect of the present invention.
Figure 26B:
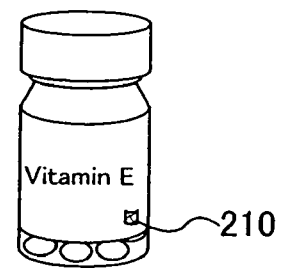
Figure 26C:
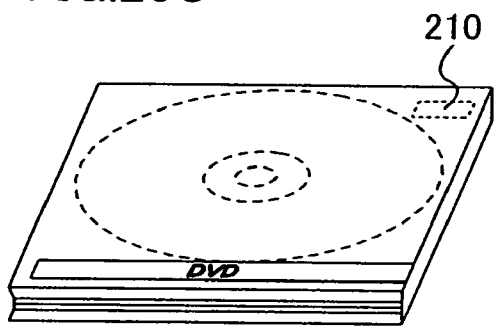
Figure 26D:
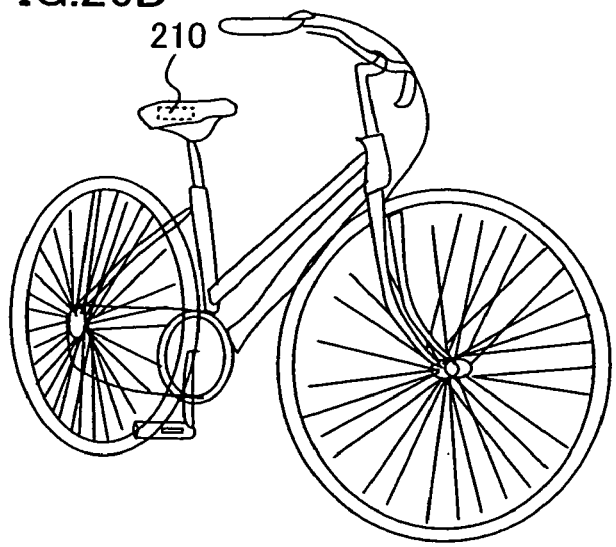
Figure 26E:
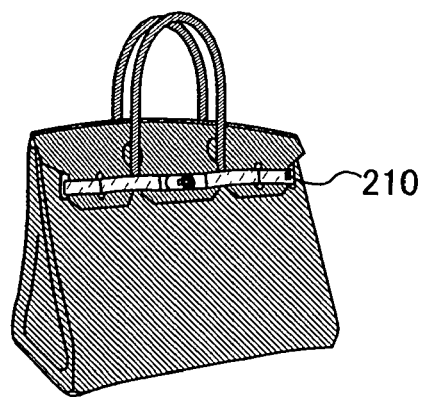

An ID chip manufactured according to the present invention is applicable in a wide range. For example, the ID chip can be applied to a bill, a coin, securities, bearer bonds, certificates (driver's license, certificate of residence, or the like; see FIG. 26A), wrapping items (wrapping paper, a bottle, or the like; see FIG. 26B), a recording medium (DVD software, a video tape, or the like; see FIG. 26C), vehicles (a bicycle or the like; see FIG. 26D), personal belongings (a bag, glasses, or the like; see FIG. 26E), foodstuffs, clothes, living wares, electronic devices, or the like. The electronic devices are a liquid crystal display device, an EL display device, a television device (also referred to as simply a TV, a TV receiving machine, or a television receiving machine), a cellular phone, and the like.

Note that the ID chip is fixed to articles by being attached to the surface thereof or mounted thereon. For example, the ID chip is desirably mounted on the base paper in the case of a book or on organic resin in the case of a package made therefrom. By providing a thin film integrated circuit inside a bill, a coin, securities, bearer bonds, certificates, or the like, the forgery can be prevented. Moreover, when the ID chip is provided in wrapping items, a recording medium, personal belongings, foodstuffs, clothes, living wares, electronic devices, or the like, an inspection system, a system at the rental shop, or the like becomes more efficient. When the ID is provided in the vehicles, the forgery and stealing can be prevented.

Figure 27A:
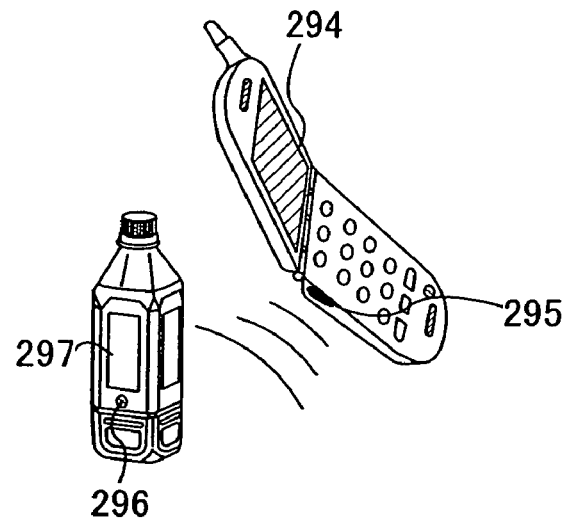
FIGS. 27A and 27B are views each showing Embodiment Mode 7 according to a certain aspect of the present invention.
Figure 27B:
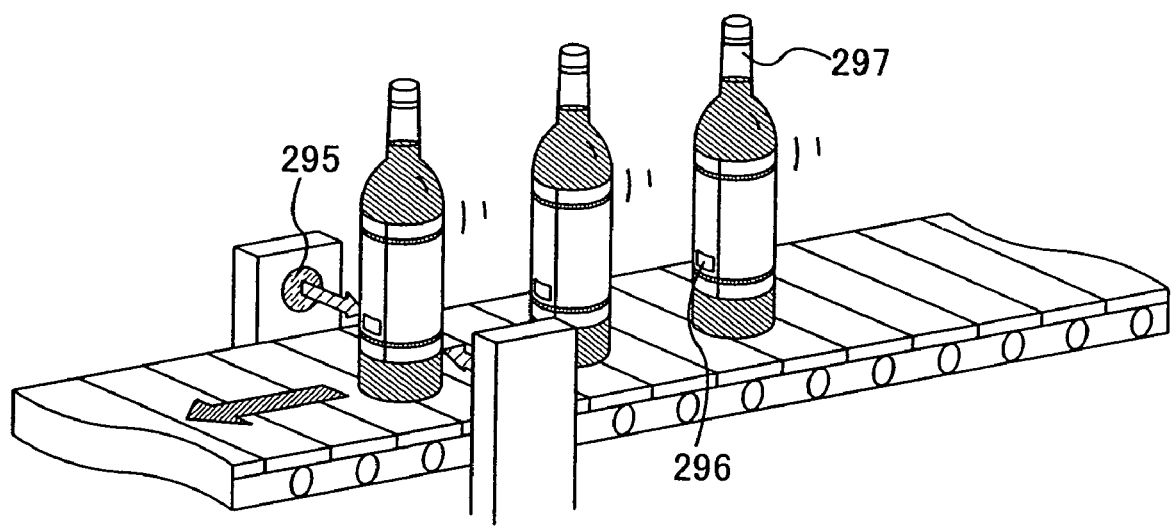

Further, a sophisticated system can be realized by applying the ID chip to a controlling system or a distribution system of articles. For example, a reader/writer 295 is provided on a side surface of a portable terminal including a display portion 294 and the ID chip 296 is provided on a side surface of an article 297 (see FIG. 27A). In this system, when the ID chip 296 is held over the reader/writer 295, the display portion 294 displays information on the article 297 such as raw materials, origins, records of distribution process, or the like. As another example, the reader/writer 295 is provided beside the belt conveyer (see FIG. 27B). In this case, the article 297 can be inspected easily.

Embodiment Mode 8

The semiconductor device shown in Embodiment Mode 1 to Embodiment Mode 3 and the display device shown in Embodiment Mode 4 can be used in manufacturing various electronic devices. Such electronic devices include, for example, a television device, a camera such as a video camera or a digital camera, a navigation system, an audio reproducing device (a car audio, an audio component, and the like), a personal computer, a game machine, a portable information terminal (a mobile computer, a cellular phone, a portable game machine, an electronic book, and the like), an image reproducing device provided with a recording medium (specifically, a device capable of reproducing a recording medium such as a Digital Versatile Disk (DVD) and that has a display capable of displaying the image), and the like. Specific examples of such electronic devices are shown in FIGS. 14A to 14G.

Figure 14A:
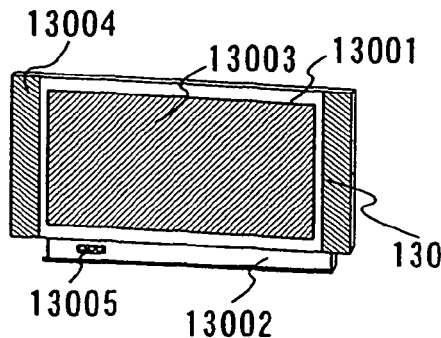
FIGS. 14A to 14G are views each showing Embodiment Mode 8 according to a certain aspect of the present invention.

FIG. 14A shows a television device, which includes a housing 13001, a supporting stand 13002, a display portion 13003, a speaker portion 13004, a video input terminal 13005, and the like. The manufacturing method and the like of a display device described in Embodiment Mode 4 can be applied to the manufacturing process of the display portion 13003 and the like; thus, the television device can be completed. The display portion 13003 can be an EL display, a liquid crystal display, or the like. Note that the television device includes all television sets such as the ones for a computer, TV broadcast reception, and advertisement display. Through the above structure, a compact and low-cost television device having high reliability can be provided.

Figure 14B:
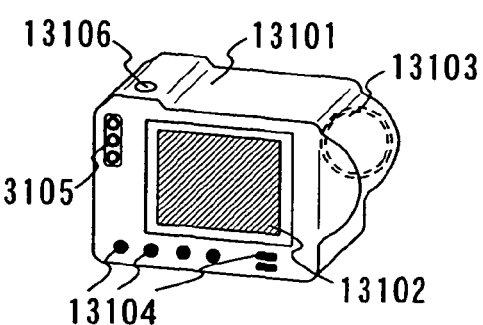

FIG. 14B shows a digital camera, which includes a main body 13101, a display portion 13102, an image receiving portion 13103, operation keys 13104, an external connecting port 13105, a shutter 13106, and the like. The manufacturing method and the like of a display device described in Embodiment Mode 4 can be applied to the manufacturing process of the display portion 13102 and the like; thus, the digital camera can be completed. Through the above structure, a compact and low-cost digital camera having high reliability can be provided.

FIG. 4C shows a computer, which includes a main body 13201, a housing 13202, a display portion 13203, a keyboard 13204, an external connecting port 13205, a pointing mouse 13206, and the like. The manufacturing method and the like of a display device described in Embodiment Mode 4 can be applied to the manufacturing process of the display portion 13203 and the like; thus, the computer can be completed. Through the above structure, a compact and low-cost computer having high reliability can be provided.

Figure 14C:
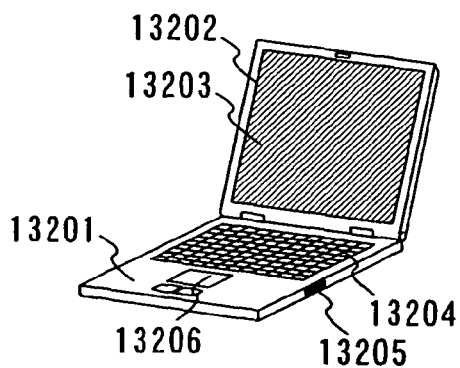
Figure 14D:
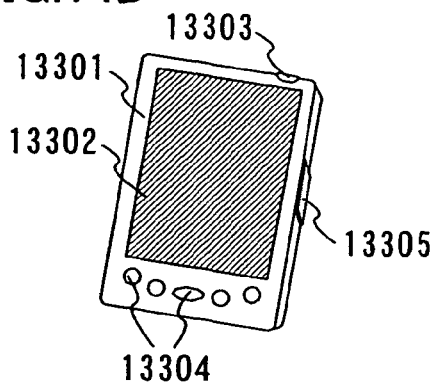

FIG. 14D shows a mobile computer, which includes a main body 13301, a display portion 13302, a switch 13303, operation keys 13304, an IR port 13305, and the like. The manufacturing method and the like of a display device described in Embodiment Mode 4 can be applied to the manufacturing process of the display portion 13302 and the like; thus, the mobile computer can be completed. Through the above structure, a compact and low-cost mobile computer having high reliability can be provided.

Figure 14E:
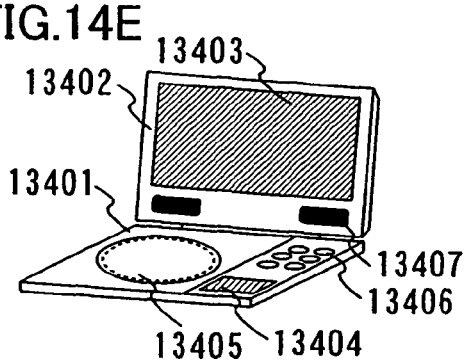

FIG. 14E shows an image reproducing device provided with a recording medium (specifically, a DVD reproducing device), which includes a main body 13401, a housing 13402, a display portion A 13403, a display portion B 13404, a recording medium (a DVD and the like) reading portion 13405, operation keys 13406, a speaker portion 13407, and the like. The display portion A 13403 mainly displays image data while the display portion B 13404 mainly displays text data. The manufacturing method and the like of a display device described in Embodiment Mode 4 can be applied to the manufacturing process of the display portion A 13403, the display portion B 13404, and the like; thus, the image reproducing device can be completed. Note that the image reproducing device provided with a recording medium includes a game machine and the like. Through the above structure, a compact and low-cost image reproducing device having high reliability can be provided.

Figure 14F:
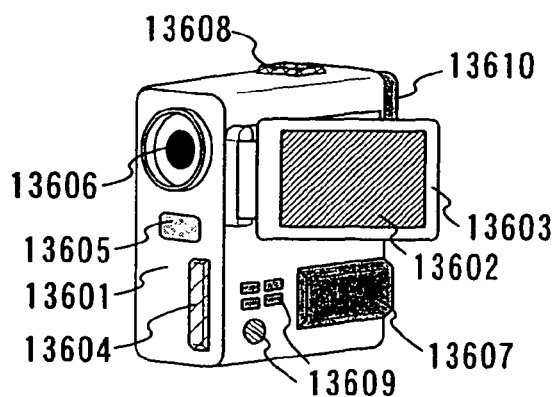

FIG. 14F shows, a video camera, which includes a main body 13601, a display portion 13602, a housing 13603, an external connecting port 13604, a remote controller receiving portion 13605, an image receiving portion 13606, a battery 13607, an audio input portion 13608, operation keys 13609, an eye piece 13610, and the like. The manufacturing method and the like of the display device described in Embodiment Mode 4 can be applied to the manufacturing process of the display portion 13602 and the like; thus, the video camera can be completed. Through the above structure, a compact and low-cost video camera having high reliability can be provided.

Figure 14G:
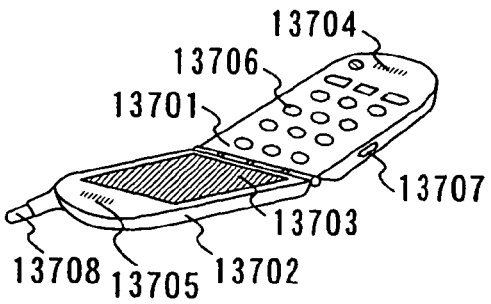

FIG. 14G shows a cellular phone, which includes a main body 13701, a housing 13702, a display portion 13703, an audio input portion 13704, an audio output portion 13705, operation keys 13706, an external connecting port 13707, an antenna 13708, and the like. The manufacturing method and the like of a display device described in Embodiment Mode 4 can be applied to the manufacturing process of the display portion 13703 and the like; thus, the cellular phone can be completed. Note that power consumption of the cellular phone can be suppressed by displaying white text on a black background of the display portion 13703. Through the above structure, a compact and low-cost cellular phone having high reliability can be provided.

In particular, the display device used for the display portion of such electronic devices includes thin film transistors for driving pixels, and desired structures of the TFTs differ according to the circuit to be used. By applying the present invention, TFTs having suitable structures for each of the various circuits can be manufactured with high accuracy; therefore, a high-quality electronic device can be manufactured with high yield.

As mentioned above, the, applicable range of the present invention is extremely wide and the present invention can thus be applied to electronic devices of various fields.

The present application is based on Japanese Patent Application serial No. 2004-321009 filed on Nov. 4, 2004 in Japanese Patent Office, the contents of which are hereby incorporated by reference.

What is claimed is:

1. A method for manufacturing a semiconductor device comprising the steps of:
   forming a gate insulating film over a semiconductor film over a substrate;
   forming a first conductive film over the gate insulating film;
   forming a second conductive film over the first conductive film;
   forming a resist over the second conductive film;
   etching the second conductive film with the use of the resist as a mask to form an etched second conductive film;
   etching the first conductive film to form an etched first conductive film;
   recessing the resist and etching the etched second conductive film by using the recessed resist as a mask to form a further etched second conductive film of which a length in a channel length direction is shorter than that of the etched first conductive film;
   forming sidewalls comprising silicon oxide in contact with side surfaces of the etched first conductive film and upper surfaces of the etched first conductive film; and
   forming a passivation film over the sidewalls,
   wherein a stage temperature is at −10° C. or less during the recessing the resist and etching the etched second conductive film.

2. The method for manufacturing a semiconductor device according to claim 1, wherein the further etched second conductive film and the etched first conductive film are a gate electrode of a thin film transistor.

3. The method for manufacturing a semiconductor device according to claim 1, wherein the etched second conductive film is formed so that a taper angle on the side surface is $80° \geq \theta \geq 90°$.

4. The method for manufacturing a semiconductor device according to claim 1, wherein the first conductive film is a TaN film.

5. The method for manufacturing a semiconductor device according to claim 1, wherein the second conductive film is a W film.

6. The method for manufacturing a semiconductor device according to claim 1, wherein etching the second conductive film and etching the first conductive film and etching the etched second conductive film are performed by a dry etching method.

7. The method for manufacturing a semiconductor device according to claim 1, wherein a difference between a length in a channel length direction of the etched second conductive film and that of the further etched second conductive film is 10 nm to 300 nm.

8. The method for manufacturing a semiconductor device according to claim 1, wherein the length in the channel length direction of the further etched second conductive film is 0.1 µm to 0.7 µm.

9. A method for manufacturing a semiconductor device comprising the steps of:
   forming a gate insulating film over a semiconductor film over a substrate;
   forming a first conductive film over the gate insulating film;
   forming a second conductive film over the first conductive film;
   forming a resist over the second conductive film;
   etching the second conductive film with the use of the resist as a mask to form an etched second conductive film;
   etching the first conductive film to form an etched first conductive film and recessing the resist to form a recessed resist; and
   recessing the recessed resist and etching the etched second conductive film by using the further recessed resist as a mask to form a further etched second conductive film of which a length in a channel length direction is shorter than that of the etched first conductive film; and
   forming sidewalls comprising silicon oxide in contact with side surfaces of the etched first conductive film and upper surfaces of the etched first conductive film; and
   forming a passivation film over the sidewalls,
   wherein a stage temperature is at −10° C. or less during the recessing the resist and etching the etched second conductive film.

10. The method for manufacturing a semiconductor device according to claim 9, wherein the further etched second conductive film and the etched first conductive film are a gate electrode of a thin film transistor.

11. The method for manufacturing a semiconductor device according to claim 9, wherein the etched second conductive film is formed so that a taper angle on the side surface is $80° \geq \theta \geq 90°$.

12. The method for manufacturing a semiconductor device according to claim 9, wherein the first conductive film is a TaN film.

13. The method for manufacturing a semiconductor device according to claim 9, wherein the second conductive film is a W film.

14. The method for manufacturing a semiconductor device according to claim 9, wherein etching the second conductive film and etching the first conductive film and etching the etched second conductive film are performed by a dry etching method.

15. The method for manufacturing a semiconductor device according to claim 9 wherein a difference between a length in a channel length direction of the etched second conductive film and that of the further etched second conductive film is 10 nm to 300 nm.

16. The method for manufacturing a semiconductor device according to claim 9, wherein the length in the channel length direction of the further etched second conductive film is 0.1 µm to 0.7 µm.

17. A method for manufacturing a semiconductor device comprising the steps of:
   forming a gate insulating film over a semiconductor film over a substrate;
   forming a first conductive film over the gate insulating film;
   forming a second conductive film over the first conductive film;
   forming a resist over the second conductive film;
   etching the second conductive film with the use of the resist as a mask to form an etched second conductive film;

etching the first conductive film to form an etched first conductive film; and recessing the resist and etching the etched second conductive film by using the recessed resist as a mask to form a further etched second conductive film of which a length in a channel length direction is shorter than that of the etched first conductive film;

forming a channel-forming region and first low-concentration impurity regions in contact with the channel-forming region and second low-concentration impurity regions in contact with the first low-concentration impurity regions in the semiconductor film by doping an impurity element with the use of the further etched second conductive film as a mask;

forming sidewalls comprising silicon oxide in contact with the side surfaces of the etched first conductive film and the further etched second conductive film;

forming high-concentration impurity regions selectively in the second low-concentration impurity regions by doping an impurity element with the use of the sidewalls and the further etched second conductive film as masks; and forming a passivation film over the sidewalls, wherein a stage temperature is at −10° C. or less during the recessing the resist and etching the etched second conductive film, and wherein the sidewalls are in contact with upper surfaces of the etched first conductive film, wherein a difference between a length in a channel length direction of the etched second conductive film and that of the further etched second conductive film is 10 nm to 300 nm, and wherein the length in the channel length direction of the further etched second conductive film is 0.1 μm to 0.7 μm.

18. The method for manufacturing a semiconductor device according to claim 17, wherein first low-concentration impurity regions below the etched first conductive film where the further etched second conductive film is not overlapped and second low-concentration impurity regions below the sidewalls in contact with the gate insulating film are formed by performing the doping with the use of the sidewalls and the further etched second conductive film as masks.

19. The method for manufacturing a semiconductor device according to claim 17, wherein the further etched second conductive film and the etched first conductive film are a gate electrode of a thin film transistor.

20. The method for manufacturing a semiconductor device according to claim 17, wherein the etched second conductive film is formed so that a taper angle on the side surface is $80° \theta \geqq 90°$.

21. The method for manufacturing a semiconductor device according to claim 17, wherein the first conductive film is a TaN film.

22. The method for manufacturing a semiconductor device according to claim 17, wherein the second conductive film is a W film.

23. The method for manufacturing a semiconductor device according to claim 17, wherein etching the second conductive film and etching the first conductive film and etching the etched second conductive film are performed by a dry etching method.

* * * * *

UNITED STATES PATENT AND TRADEMARK OFFICE
CERTIFICATE OF CORRECTION

PATENT NO. : 8,008,140 B2  
APPLICATION NO. : 11/256086  
DATED : August 30, 2011  
INVENTOR(S) : Mayumi Yamaguchi et al.

It is certified that error appears in the above-identified patent and that said Letters Patent is hereby corrected as shown below:

ON THE TITLE PAGE:

Item (54), "electrode" should be --gate electrode--;

IN THE SPECIFICATIONS:

At Column 1, line 3 "electrode" should be --gate electrode--;

At column 17, line 45, "films" should be --film--;

At column 25, line 34, "111D" should be --11D--;

At column 28, line 7, "FIG. 4C" should be --FIG. 14C--.

Signed and Sealed this
Twentieth Day of March, 2012

David J. Kappos
*Director of the United States Patent and Trademark Office*